US006774721B1

(12) United States Patent
Popescu et al.

(10) Patent No.: US 6,774,721 B1
(45) Date of Patent: Aug. 10, 2004

(54) HIGH SPEED LOGIC CIRCUITS

(75) Inventors: Petre Popescu, Ottawa (CA); Junxian Weng, Ottawa (CA); David Alexander Brinton Dobson, Ottawa (CA); Guy Jacque Joseph Fortier, Ottawa (CA)

(73) Assignee: Quake Technologies, Inc., San Jose, CA (US)

(*) Notice: Subject to any disclaimer, the term of this patent is extended or adjusted under 35 U.S.C. 154(b) by 0 days.

(21) Appl. No.: 10/406,360

(22) Filed: Apr. 4, 2003

Related U.S. Application Data

(60) Provisional application No. 60/452,495, filed on Mar. 7, 2003.

(51) Int. Cl.[7] .................................................. H03F 3/45
(52) U.S. Cl. ........................ 330/253; 330/257; 330/260; 326/115; 326/127
(58) Field of Search .................................. 326/115, 126, 326/127, 119, 112, 86, 121; 327/52, 50, 65, 81, 89; 330/253, 261, 263

(56) References Cited

U.S. PATENT DOCUMENTS

| | | | |
|---|---|---|---|
| 4,958,133 A | * 9/1990 | Bazes | ........................ 330/253 |
| 5,703,532 A | * 12/1997 | Shin et al. | ................... 330/253 |
| 6,340,899 B1 | 1/2002 | Green | |
| 6,424,194 B1 | 7/2002 | Hairapetian | |
| 6,469,579 B2 | * 10/2002 | Bazes | ........................ 330/253 |
| 6,642,790 B2 | * 11/2003 | Schrodinger et al. | ........ 330/253 |
| 6,642,791 B1 | * 11/2003 | Balan | ........................ 330/253 |

OTHER PUBLICATIONS

David Johns and Ken Martin, "Analog Integrated Circuit Design", p142–144, John Wiley&Sons, 1997.
"Fully integrated 5.35–GHz CMOS VCOs and prescalers" by Chih–Ming Hung et al., IEEE Transactions on Microwave Theory and Techniques, vol. 49, No. 1, Jan. 2001, p. 17.
"A fully integrated 1.5–V 5.5–GHz CMOS phase–locked loop" by Chih–Ming Hung et al., IEEE Journal of SolidState Circuits, vol. 37, No. 4, Apr. 2002, p. 521.
"Bandwidth Extension in CMOS with optimized on–chip inductors" by Sunderarajan S. Mohan et al., IEEE Journal of Solid–State Circuits, vol. 35, No. 3, Mar. 2000, p. 346.
"A CMOS interface circuit for detection of 1.2Gb/s RZ data" by Jafar Savoj et al., 1999 IEEE International Solid–State Circuits Conference.

* cited by examiner

*Primary Examiner*—Vibol Tan
(74) *Attorney, Agent, or Firm*—IP-MEX; Victoria Donnelly

(57) ABSTRACT

Quake Transistor Logic (QTL) circuits of the embodiments of the invention are low power, high-speed circuits that can be manufactured by the same process as the lower-speed complex circuits, and are thus capable of being integrated on the same device. A number of techniques are employed to give QTL circuits their unique advantages. Lower power without loss of speed is achieved through the use of a self-biasing clock buffer to eliminate the need for tail current sources in the logic; differential signals are employed throughout to improve noise immunity with a low logic signal swing; an optional tuning circuit provides extension of the frequency response to achieve an even higher clock frequency and logic circuit bandwidth.

32 Claims, 16 Drawing Sheets

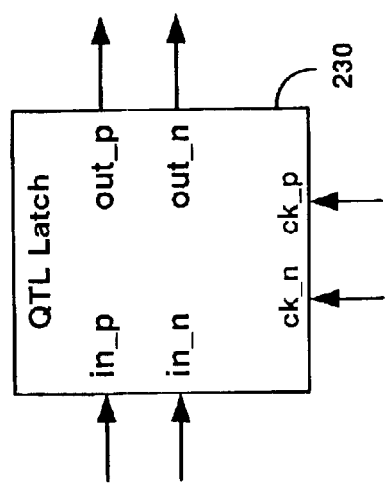
*FIG. 11D*
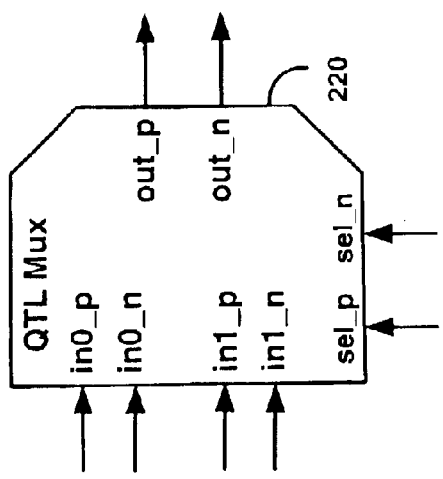
*FIG. 11C*
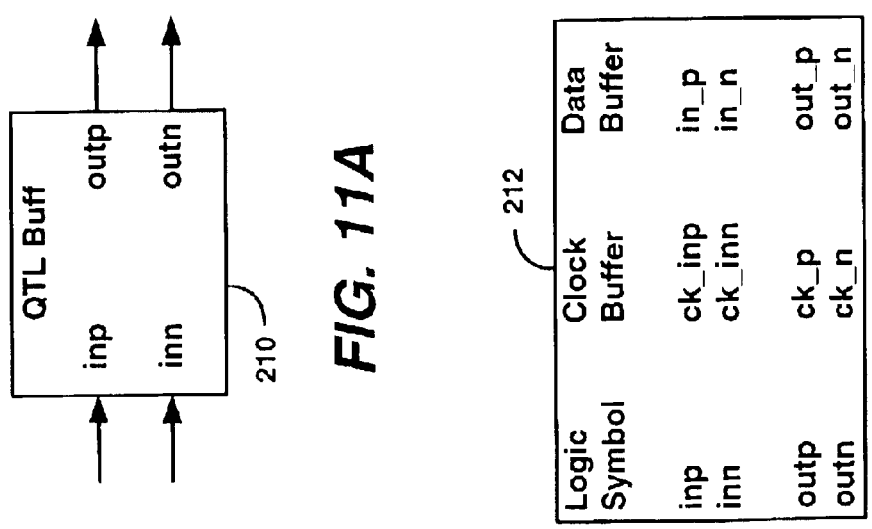
*FIG. 11A*
*FIG. 11B*

HIGH SPEED LOGIC CIRCUITS

RELATED APPLICATIONS

The present patent application claims priority from the U.S. provisional patent application Ser. No. 60/452,495 to Petre Popescu et al. entitled "High Speed CMOS Logic Circuits" filed on Mar. 07, 2003.

FIELD OF THE INVENTION

The invention relates to electronic circuitry, and in particular to high-speed logic circuits and applications thereof.

BACKGROUND OF THE INVENTION

With recent advances in the electronic industry, logic circuits of increased speeds are required to process high speed signals, for example 10 Gigabit/second and ultimately 40 Gigabit/second serial bit streams arising in fiber optic transmission systems.

At the same time, the logical complexity of the circuits is constantly increasing in order to meet ever increasing complexity and numerous requirements of processing, for example of SONET and fast Ethernet protocols.

To meet these requirements, silicon circuits using smaller geometry are being developed. Smaller geometry technology, such as "0.18 micron technology" and below, provides the capability to design high density and complex CMOS circuits. The smaller geometry technology also provides a capability for higher speed circuitry.

Current Mode Logic (CML) circuitry has been developed by the industry to provide a high-speed logic circuit technology, which is compatible with CMOS circuitry, and allows the fabrication of both types of circuits in one device, or chip. Typically, the CMOS circuitry would provide the high-density complex logic processing part of the chip, while CML circuitry would be used in the high-speed serial interfaces that run at the serial bit rate and convert between the serial bit streams and the parallel bus signals processed by the CMOS circuitry. The speed of the serial interface may thus be many times higher than the speed of the CMOS circuitry.

In conventional synchronous logic design, a clock circuit drives the logic circuits including combinatorial logic functions (AND, OR, Mux, etc.) and storage elements (D-type flip-flops). In order to provide high-speed operation, it is necessary to control the current through each circuit to prevent saturation of the transistors (if bipolar technology is used) or triode region operation (if MOS technology is used).

A theoretical analysis of a basic CML circuitry can be found in the book "Analog Integrated Circuit Design" by David Johns and Ken Martin, published by John Wiley & Sons, 1997, pp. 142. An exemplary implementation of the CML circuitry, based on tail current sources (bias stage) and differential current steering through transistor pairs, as described, e.g. in the U.S. Pat. No. 6,424,194 to Hairapetian U.S. Pat. No. 6,424,194 entitled "Current-controlled CMOS logic family" issued Jul. 23, 2002, will be described with reference to FIGS. 1A to 1C below.

FIG. 1A shows one example of the prior art circuit arrangement 10 of a CML Logic Circuit 11 including a logic function circuit 12 coupled to a current source 14, and a CML Clock Buffer 15 including a driver circuit 16 coupled to a current source 18. The differential output 17 of the driver circuit 16 of the CML Clock Buffer 15 is coupled to a differential clock input 19 of the logic function circuit 12 of the CML Logic Circuit 11. The input 13 of the driver circuit 16 of the CML Clock Buffer 15 is connected to a clock source (not shown). The differential output 19a of the logic function circuit 12 of the CML Logic Circuit 11 is connected to other logic circuits (not shown). The logic function circuit 12 may include other differential inputs (illustrated by a straight unmarked line extending from the logic function circuit 12 on its left) connected to the outputs of other logic function circuits 12 (not shown).

The current source 14 of the CML Logic Circuit 11 provides a bias current to the logic function circuit 12, thus setting its operating point. Similarly, the current source 18 of the CML Clock Buffer 15 provides a bias current to the driver circuit 16, thus setting its operating point.

FIGS. 1B and 1C of the prior art show the details of the CML Logic Circuit 11 implemented in two technologies, namely the CML Logic Circuit 11 implemented by using a bipolar technology (CML Logic Circuit 20) and by using MOS technology (CML Logic Circuit 30) respectively. The detailed circuits 20 or 30 are representative of the combination of a typical logic function circuit 12 and current source 14 of the prior art.

The bipolar CML circuit 20 comprises transistors Q30, Q31n, Q31p, Q32n, Q32p, Q33n, and Q33p, as well as resistors R30, R31n, and R31p. The circuit is connected to power supply terminals Vcc, Vee, and a bias supply Vbias.

Differential data inputs in_n and in_p of the circuit are connected to an input data source (not shown), differential clock inputs ck_n and ck_p of the circuit are connected to a clock buffer (not shown), and differential data outputs out_n and out_p of the circuit are connected to a subsequent logic circuits (not shown). Differential inputs and outputs are pairs of terminals designated with the subscripts_n (negative) and_p (positive).

The power supply terminal Vcc is connected to a first lead 21 of the resistor R31n and a first lead 22 of the resistor R31p. Second leads of the resistors R31n and R31p (23 and 24) are respectively connected to the differential data outputs out_n and out_p. Also connected to the negative data output terminal out_n are the collectors of the transistors Q32n and Q32p as well as the base of the transistor Q33p. Further connected to the positive data output terminal out_p are the collectors of the transistors Q33n and Q33p as well as the base of the transistor Q32p. The differential data inputs in_n and in_p are connected to the bases of the transistors Q33n and Q32n respectively. The emitters of the transistors Q33n and Q32n are tied together and connected to the collector of the transistor Q31n. The emitters of the transistors Q33p and Q32p are tied together and connected to the collector of the transistor Q31p. The differential clock inputs ck_n and ck_p are connected to the bases of the transistors Q31n and Q31p respectively. The emitters of the transistors Q31n and Q31p are tied together and connected to the collector of the transistor Q30. The base of the transistor Q30 is connected to the bias supply Vbias, and the emitter of the transistor Q30 is connected to a first lead 25 of the resistor R30. A second lead of the resistor R30 (26) is connected to the power supply terminal Vee.

Transistors Q31n, Q31p, Q32n, Q32p, Q33n, and Q33p and resistors R31n and R31p form a conventional latch circuit, providing a latch function: the value of the signal at the differential inputs in_n and in_p are transferred to the differential outputs out_n and out_p upon activation of the differential clock inputs ck_n and ck_p. Upon de-activation of the differential clock inputs ck_n and ck_p, the latch retains the output value due to the cross-coupling between the outputs out_p and out_n, and the bases of the transistors Q32p and Q33p respectively.

The current source 14 of the bipolar CML circuit 20 includes the transistor Q30, the resistor R30, and the bias supply Vbias, to supply the bias current to the latch circuit (the logic function circuit 12).

In the CML circuits 20 of the prior art, the current source supplies a fixed current to the latch circuit, regardless of the operational state of the latch. This current flows through one of resistors R31n or R31p; through only one of the transistors Q32n, Q32p, Q33n, Q33p; and through one of the transistors Q31n and Q31p, depending on the state of the differential inputs in_n and in_p, and the differential clock inputs ck_n and ck_p.

The bias current is set, by the combination of the value of the bias supply Vbias and the resistor R30, to ensure that the voltage drop across resistors R31n or R31p (depending on the operational state of the latch) is high enough as a logic signal (voltage swing) at the circuit outputs out_n and out_p, but is not so high as to saturate the transistors.

The type of current source that is inserted between the power supply terminal Vee and the logic circuit proper is also referred to as a tail current source.

The MOS CML circuit 30 is analogous to the bipolar CML circuit 20, but contains MOS transistors M30, M31n, M31p, M32n, M32p, M33n and M33p in place of bipolar transistors Q30, Q31n, Q31p, Q32n, Q32p, Q33n and Q33p.

The current source 14 of the MOS CML circuit 30 comprises the transistor M30 and the bias supply Vbias.

It follows from the above description that the voltage differential between the power supply terminals Vcc and Vee is distributed over five circuit elements in series in the case of the bipolar CML circuit 20, or four circuit elements in series in the case of the MOS CML circuit 30.

The voltage differential between the power supply terminals Vcc and Vee is determined by the technology (e.g. approximately 1.8 Volts for 0.18 micron CMOS technology) and therefore is inherently limited, because a smaller geometry technology, while yielding faster and more densely packed circuits, also implies a lower breakdown voltage for the devices.

As a result, a lower supply voltage has to be used for the smaller geometry circuits, which has several disadvantages: a lower drive voltage reduces the speed; and the distribution of the supply voltage across several logic stages and the bias stage leaves even less voltage available for each stage, thus further reducing the speed, and making the circuitry unsuitable for many higher speed applications.

Several techniques have been proposed in the industry to ameliorate this problem, for example, by eliminating the tail current source for biasing the circuit and replacing it by active biased loads in place of resistor loads, see, e.g. papers "Fully integrated 5.35-GHz CMOS VCOs and prescalers" by Chih-Ming Hung et al., IEEE Transactions on Microwave Theory and Techniques, vol. 49, no. 1, January 2001, p. 17, and "A fully integrated 1.5-V 5.5-GHz CMOS phase-locked loop" by Chih-Ming Hung et al., IEEE Journal of Solid-State Circuits, vol. 37, no. 4, April 2002, p. 521.

Additionally, it has been proposed to further enhance the bandwidth of existing high-speed circuits by using optimized on-chip inductors to extend the frequency range of the circuits to higher speeds. Several of such enhancements have been described in the U.S. Pat. No. 6,340,899 to Green entitled "Current-Controlled CMOS Circuits with Inductive Broadbanding" issued Jan. 22, 2002, in the paper "Bandwidth Extension in CMOS with optimized on-chip inductors" by Sunderarajan S. Mohan et al., IEEE Journal of Solid-State Circuits, vol. 35, no. 3, March 2000, p. 346, and in another paper "A CMOS interface circuit for detection of 1.2 Gb/s RZ data" by Jafar Savoj et al., 1999 IEEE International Solid-State Circuits Conference.

Unfortunately, the prior art techniques, while providing partial solutions to the above-mentioned problems, are inherently limited to high-speed applications operating at speeds of around 5 GHz or somewhat above and may not be always suitable for higher and substantially higher speed applications.

Accordingly, there is a need in the industry for further development of improved and flexible logic circuits, which would be suitable for high-speed applications.

SUMMARY OF THE INVENTION

Therefore it is an objective of the invention to provide high-speed logic circuits, which avoid the above-mentioned problems.

According to one aspect of the invention there is provided an electronic circuit arrangement, comprising:

a logic circuit having a differential input and a self-biasing clock buffer having a differential output, the self-biasing clock buffer comprising a driver circuit and a biasing circuit;

the driver circuit determining its operating point via negative feedback through the biasing circuit;

the differential output of the self-biasing clock buffer supplying a differential signal to the differential input of the logic circuit, the differential signal depending on the operating point of the driver circuit; and the operating point of the logic circuit being set by the differential signal.

The operating point of the logic circuit is set through the common mode bias of the differential signal, the self-biasing clock buffer has an input, which is AC-coupled, and the differential signal is DC-coupled between the differential output of the self-biasing clock buffer and the differential input of the logic circuit.

The biasing circuit comprises a first and second of low-pass filters, and the self-biasing clock buffer comprises a first and second amplifier, each amplifier having an AC-coupled input, a biasing point and an output, the first and second low-pass filters providing the negative feedback from the output to the biasing point of the corresponding amplifiers.

Beneficially, each amplifier comprises a MOS transistor, the biasing point of the amplifier being the gate of the transistor and the output being the drain of the transistor. Advantageously, the logic circuit and the self-biasing clock buffer are made on the same substrate and by the same technology. The operating point of the logic circuit may be further determined by relative sizes of MOS transistors between the logic circuit and the self-biasing circuit as required.

Additionally, for extending the frequency response of the circuit arrangement and the bandwidth of the logic circuit, one or both of the driver circuit and the logic circuit may comprise a tuned means for modifying the frequency response of the respective circuit, the tuned means comprising one of the following:

an inductive means adjusted to increase (he bandwidth of the respective circuit; and a resonant means adjusted to resonate at substantially the frequency of the differential signal.

In the embodiments of the invention, the logic circuit is one or more of the following:

a multiplexer circuit;

a latch circuit;

a data buffer; and a flip-flop comprising two latch circuits.

The multiplexer circuit has a differential select input and a first and second differential data input, and the differential signal is applied to the differential select input.

Advantageously, the logic circuit described above is a flexible logic circuit comprising:

an upper group of two transistor pairs, and a lower group of two transistor pairs;

each group of transistors pairs comprising a left pair of transistors and a right pair of transistors;

the sources of the transistors in the lower group being connected to a first power supply terminal;

the drains of the transistors in the lower group are connected to the sources of the corresponding transistors in the upper group;

the drains of the transistors of the left pair in the upper group are connected to a first lead of a load element whose second lead is connected to a second power supply terminal;

the drains of the transistors of the right pair in the upper group are connected to a first lead of another load element whose second lead is connected to the second power supply terminal;

the drains of the transistors of the left and right pairs in the upper group providing the differential output of the flexible logic circuit;

the gates of the transistors are capable of being connected to differential outputs of any of the following according to a required topology:

of the clock buffer;

of said flexible logic circuit;

of another logic circuit; and the topology determining a required logic function of the flexible logic circuit.

Conveniently, the load elements are resistors. Additionally, one or both of the driver circuit and the flexible logic circuit comprises a tuned means for modifying the frequency response of the respective circuit, the tuned means comprising one of the following:

an inductive means adjusted to increase the bandwidth of the respective circuit; and a resonant means adjusted to resonate at substantially the frequency of the differential signal.

In the embodiments of the invention the topology of the flexible logic circuit is chosen o that the required logic function is that of a multiplexer or of a latch.

If required, the logic circuit may comprise more than one logic circuit driven by the elf-biasing clock buffer, wherein said more than one logic circuits are optionally connected through one or more data buffers. Conveniently, said more than one logic circuits are interconnected so as to form one or more of the following:

a serializer;

a deserializer;

a clock divider;

a phase detector.

The circuit arrangement of the embodiments of the invention may be manufactured on the same substrate in combination with other circuitry, e.g. the circuit arrangement being implemented as MOS circuitry, and the other circuitry being implemented as CMOS circuitry. The MOS circuitry may provide a bridge between serial high speed input and output (IO) ports, and the CMOS circuitry may comprise a communications processor.

According to another aspect of the invention there is provided a circuit arrangement comprising circuitry of a first technology and another circuitry of a second technology, the circuitry of the first technology including:

a logic circuit having a differential input and a self-biasing clock buffer having a differential output, the self-biasing clock buffer comprising a driver circuit and a biasing circuit;

the driver circuit determining its operating point via negative feedback through the biasing circuit;

the differential output of the self-biasing clock buffer supplying a differential signal to the differential input of the logic circuit, the differential signal depending on the operating point of the driver circuit; and the operating point of the logic circuit being set by the differential signal.

Beneficially, the first technology is MOS, and the second technology is CMOS. The circuit arrangement described above may be part of a semiconductor device, and if required, it may be manufactured in an electronic package.

The embodiments of the invention, including a novel high-speed circuit family described above and termed QTL (Quake Transistor Logic), provides the following advantages.

A novel clock buffer design provides a differential clock signal with a common mode DC bias eliminating the need for tail current sources in the logic circuits, thus improving performance.

Further advantages in lower power consumption and higher maximum operating speed are provided by differential tuned clock buffers and corresponding design of the logic circuits.

A flexible logic circuit topology provides the ability to optimize each circuit for specific needs, such as voltage swing, power, and propagation time.

The low power requirement and the very high operating speed enable the circuits of the embodiments of the invention to be combined with other, lower speed circuits on a single substrate, e.g. silicon substrate, by using a common manufacturing technology, e.g. CMOS.

BRIEF DESCRIPTION OF THE DRAWINGS

Embodiments of the invention will now be described by way of example, with reference to the accompanying drawings in which:

FIG. 11A shows a logical symbol for one of the QTL clock buffer of FIG. 3 and QTL data buffer of FIG. 10 respectively;

FIG. 11B shows a table of signals providing a correspondence of the signal names used in the logic symbol of FIG. 11A with the circuit terminal names used in the circuit diagrams of FIGS. 3 and 10;

FIG. 11C shows logical symbols for the QTL multiplex circuit of FIGS. 4 to 6;

FIG. 11D shows logical symbols for the QTL latch circuits of FIGS. 7 to 9;

DETAILED DESCRIPTION OF THE EMBODIMENTS OF THE INVENTION

The embodiments of the invention illustrated in FIGS. 2 to 10 provide an electronic circuit arrangement, including a logic circuit having a differential input and a self-biasing clock buffer having a differential output, the self-biasing clock buffer comprising a driver circuit and a biasing circuit;

the driver circuit determining its operating point via negative feedback through the biasing circuit;

the differential output of the self-biasing clock buffer supplying a differential signal to the differential input of the logic circuit, the differential signal depending on the operating point of the driver circuit; and the operating point of the logic circuit being set by the differential signal.

In such electronic arrangement, the novel logic circuit does not waste part of the power supply voltage differential on a tail current source circuitry, and the novel clock buffer is provided that generates a common mode biased clock signal to correctly bias the logic circuit directly.

This concept will be explained in more detail, illustrated by a combination of a QTL clock buffer and a QTL logic circuit of the embodiments of the invention in FIG. 2; an embodiment of a QTL clock buffer shown in FIG. 3A; and embodiments of QTL logic circuits shown in FIGS. 4A–10A.

In applications of clocked synchronous logic circuits where the highest operational frequency (clock rate) is known, and the next lower operational frequency is about one half of the highest operational frequency or less, it is possible to tune the circuits for optimal operation. In modifications of the embodiments, shown in FIGS. 3D, 4B–9B and 11B, a tuning circuit is added to the circuits to provide enhanced high-speed performance.

Figure 1:
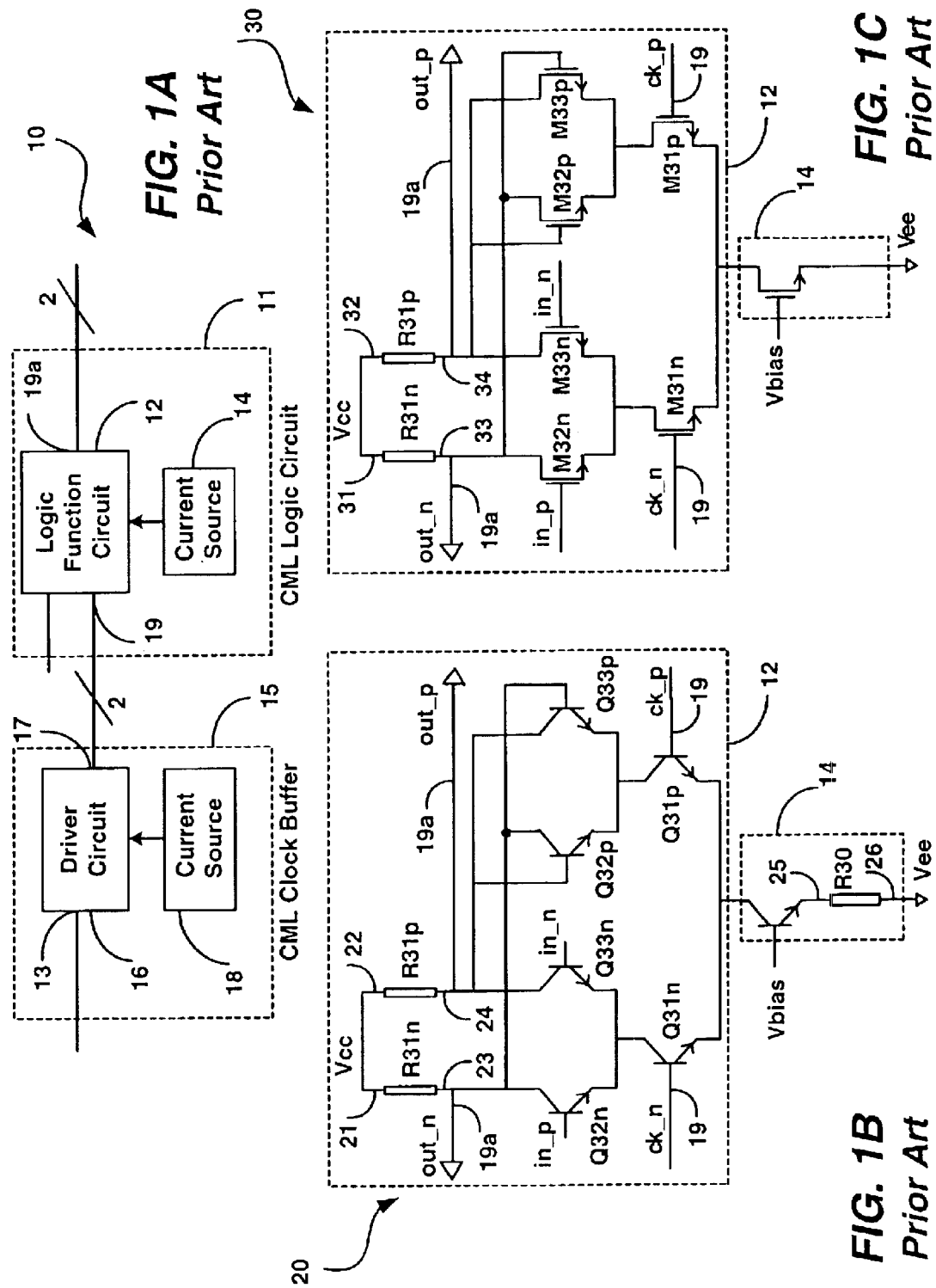
FIG. 1A shows block diagram of a prior art circuit arrangement including a CML clock buffer and a CML logic circuit.
FIG. 1B shows a detailed circuit diagram of a bipolar CML logic circuit of FIG. 1A.
FIG. 1C shows a detailed circuit diagram of a MOS CML logic circuit of FIG. 1A.
Figure 2:
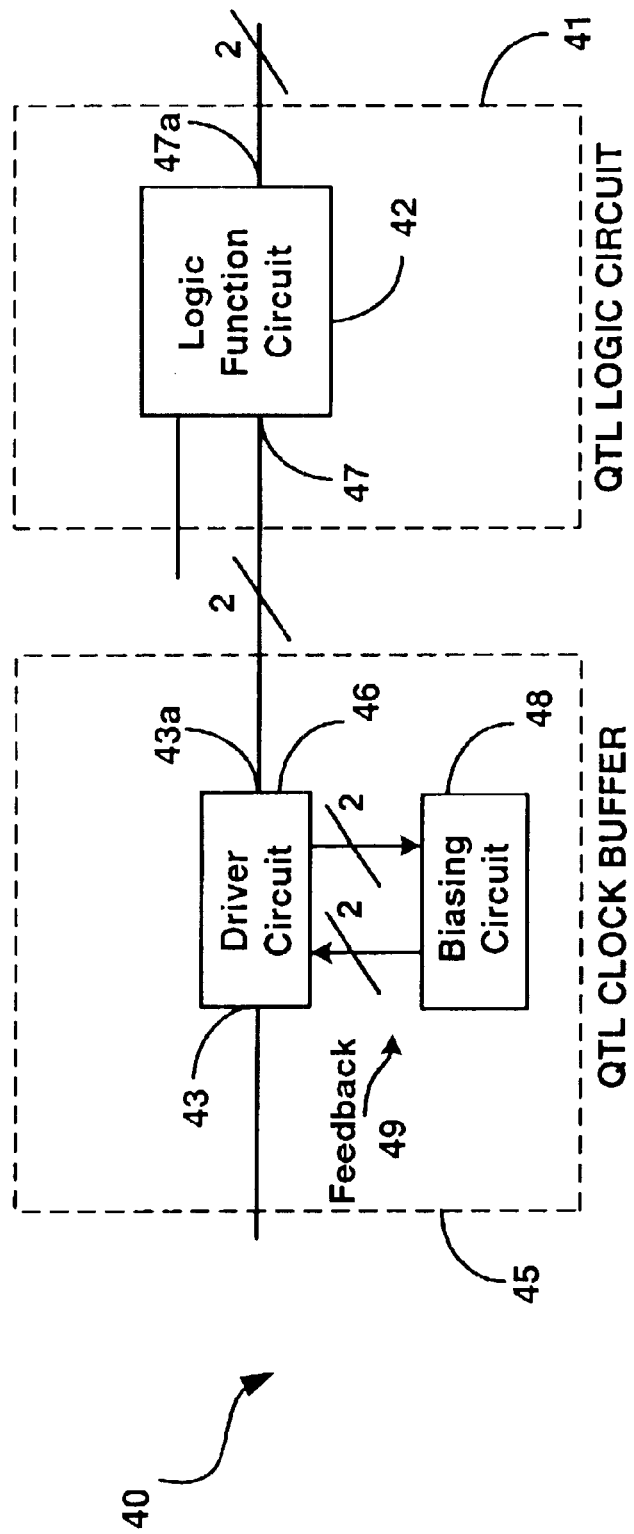
FIG. 2 shows a block diagram of a QTL circuit arrangement including a QTL clock buffer and a QTL logic circuit of the embodiments of the invention.

FIG. 2 shows a block diagram of an electronic circuit arrangement 40 of the embodiments of the invention, comprising of a QTL Logic Circuit 41 including a logic function circuit 42, and a QTL Clock Buffer 45 including a driver circuit 46 coupled to a biasing circuit 48 via the feedback connections 49. The differential output 43a of the driver circuit 46 of the QTL Clock Buffer 45 is DC-coupled to a differential clock input 47 of the logic function circuit 42 of the QTL Logic Circuit 41. The input 43 of the driver circuit 46 of the QTL Clock Buffer 45 is connected to a clock source (not shown). The differential output 47a of the logic function circuit 42 of the QTL Logic Circuit 41 is connected to other logic circuits (not shown). The logic function circuit 42 may have other differential inputs (illustrated by a straight unmarked line extending from the logic function circuit 12 on its left) connected to the outputs of other logic function circuits 42 (not shown). 10055Self-biasing of the driver circuit 46 of the QTL clock buffer is achieved via the feedback connections 49 to the biasing circuit 48. This function will be explained in detail with the help of FIGS. 3A and 3B below.

In the following description, the terms "clock buffer" and "QTL clock buffer" are used interchangeably and refer to a QTL clock buffer of the embodiments of the invention.

Similarly the description of the logic circuits will refer to QTL logic circuits of various embodiments, even if the term "QTL" is omitted for brevity.

Figures 3A, 3B:
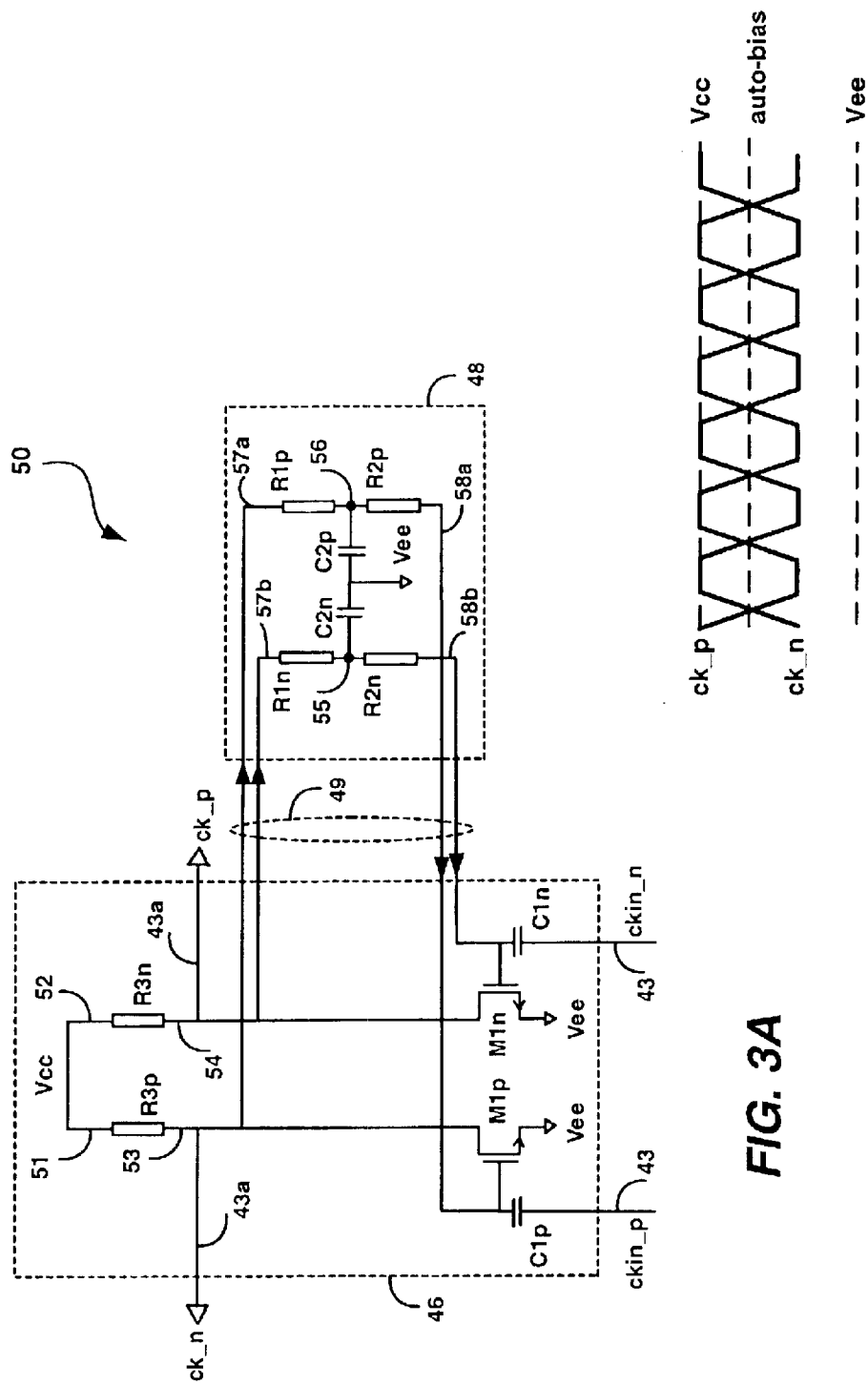
FIG. 3A shows a detailed circuit diagram of the QTL clock buffer of FIG. 2.
FIG. 3B shows a timing diagram of the QTL clock buffer of FIG. 3A.

FIG. 3A shows a detailed circuit diagram of the QTL clock buffer 50 of FIG. 2, the clock buffer to be used in the embodiments of the circuit arrangement 40. The clock buffer 50 has external connections to power supply terminals Vcc and Vee, to differential clock generator inputs ckin_p and ckin_n, and to differential clock output terminals ck_n and ck_p. The clock buffer 50 includes the driver circuit 46 and the biasing circuit 48.

The driver circuit 46 comprises first and second amplifiers including MOS transistors M1p and M1n respectively; resistors R3p and R3n; and capacitors C1a and C1p. In the driver circuit 46, the power supply terminal Vcc is connected to a first lead 51 of the resistor R3p and a first lead 52 of the resistor R3n. A second lead 53 of the resistor R3p is connected to the clock output terminal ck_n and the drain of transistor M1p. A second lead 54 of the resistor R3n is connected to the clock output terminal ck_p and the drain of the transistor M1n. The capacitor C1p is connected from the clock input terminal ckin_p to the gate of the transistor M1p. The capacitor C1n is connected from the clock input terminal ckin_n to the gate of the transistor M1n. The source of the transistor M1p and the source of the transistor M1n are connected to the power supply terminal Vee.

The first and second amplifiers function as inverting amplifiers, the resistors R3p and R3n being conveniently chosen as load elements.

The biasing circuit 48 comprises resistors R1n, R1p, R2n and R2p; and capacitors C2n and C2p. In the biasing circuit 48, the resistors R1n, R2n, and the capacitor C2n are connected together at a node 55; the resistors R1p, R2p and the capacitor C2p are connected together at a node 56; the capacitor C2n is connected between the node 55 and the power supply terminal Vee; and the capacitor C2p is connected between the node 56 and the power supply terminal Vee.

The feedback connections 49 are implemented as a negative feedback loop in the following manner: the drains of the transistors M1p and M1n in the driver circuit 46 are connected to the free ends 57a and 57b of the resistors R1p and R1n in the biasing circuit 48 respectively, and the free ends 58a and 58b of the resistors R2p and R2n in the biasing circuit 48 are connected to the gates of the transistors M1p and M1n in the driver circuit 46 respectively.

The clock buffer 50 performs the function of amplifying the differential clock signal ckin_p and ckin_n (received from an oscillator or other frequency source) to generate a differential clock signal ck_n and ck_p capable of driving the clock inputs of one or more logic circuits (FIGS. 4–9) or data buffers (FIG. 10). The differential clock input is AC-coupled through the capacitors C1p and C1n, and the differential clock output is direct coupled, providing both a differential component (the clock) and a common-mode DC component (or common mode bias voltage).

The circuit 50 consists of two halves, the components with suffix 'p' forming a first half circuit, the components with suffix 'n' forming the second half circuit. Each half circuit operates in the same manner, but independently of the other half circuit. Because the clock input 13 (ckin_p and ckin_n) is differential, the two circuit halves process opposite phases of the clock signal.

FIG. 3B shows a timing diagram of the clock output signals ck_n and ck_p of the clock buffer 50. The clock output signal ck_n is substantially a square wave at the clock frequency, oscillating between the supply voltage (Vcc) and around an average DC bias component (auto-bias). The clock output signal ck_p is a also substantially a square wave at the clock frequency, oscillating between the supply voltage (Vcc) and around an average DC bias component (auto-bias), but shifted in phase by 180 degrees with respect to the clock output signal ck_n.

The biasing circuit 48 (see FIG. 3A) performs the function of first and second low-pass filters comprised of R1n, C2n, and R2n; and R2p, C2p, and R2p respectively. Each low-pass filter provides a feedback path from the drain of the transistor M1n or M1p to its gate. As a result, the DC bias component from the clock output signals ck_p and ck_n is filtered and becomes the bias voltage at the gates of the transistors M1n and M1p respectively. The clock components contained in the feedback signals are suppressed by the low-pass filter. However, no DC current flows through the low-pass filters since the transistors M1n and M1p are MOS transistors (the gate is insulated). The DC bias component (auto-bias) is thus automatically adjusted by the action of the transistors M1n and M1p, in effect generating sufficient current, such that the average voltage drop in R3n and R3p respectively biases the gates of the transistors M1n and M1p correctly. By selecting the active device size (a manufacturing parameter of the transistors M1n and M1p) and the values of the resistors R3n and R3p, the operating point of the clock buffer 50 can be optimized for speed and voltage swing.

Figures 3C, 3D:
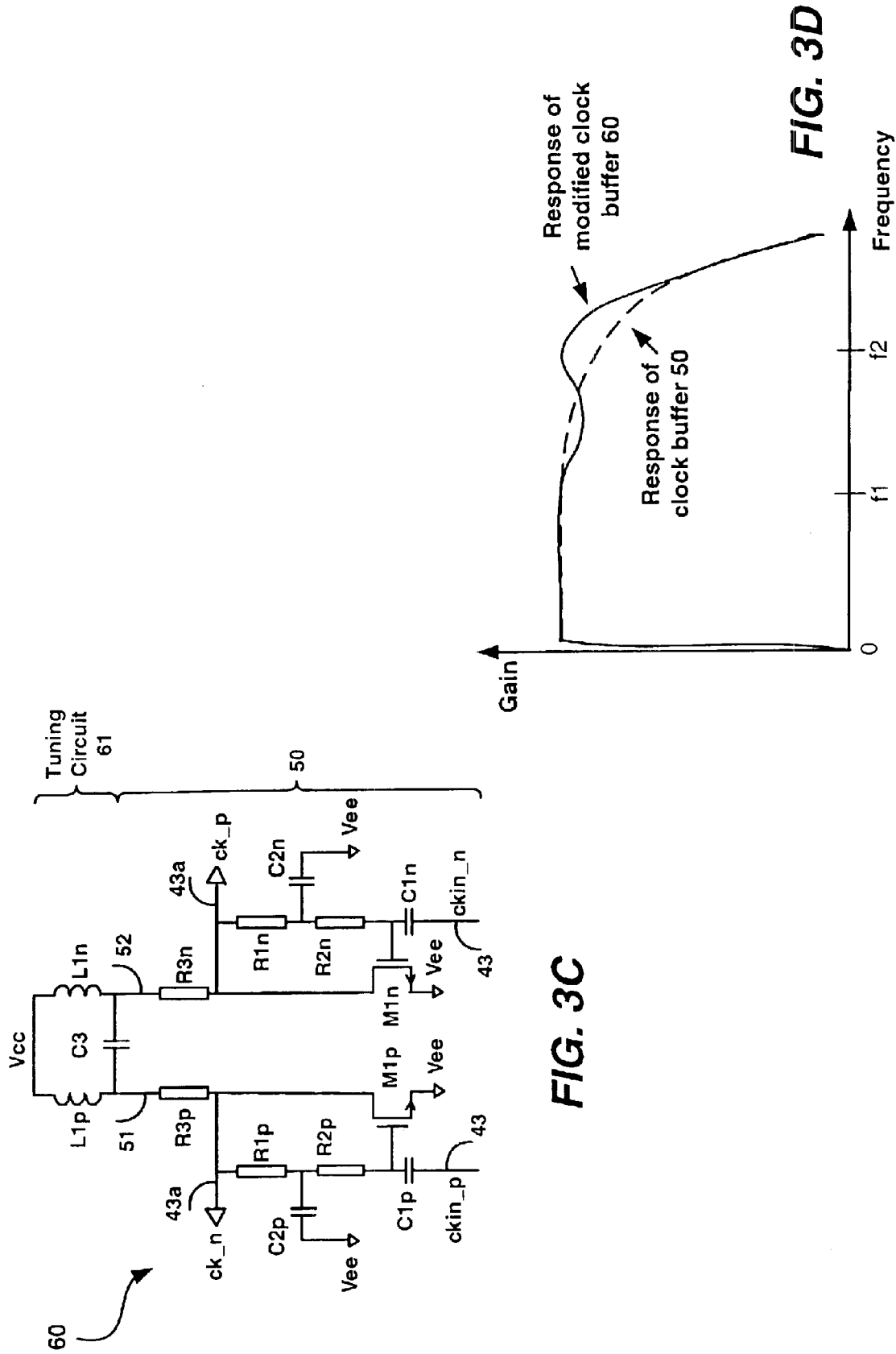
FIG. 3C shows a detailed circuit diagram of a modified QTL clock buffer of FIG. 3A.
FIG. 3D shows a frequency response chart of the modified QTL clock buffer of FIG. 3C.

FIG. 3C shows a detailed circuit diagram of a modified QTL clock buffer of FIG. 3A. The modified clock buffer 60 comprises all components of the clock buffer 50, and in addition has a tuned means including a resonant means, which are implemented with a tuning circuit 61 comprising inductors L1p and L1n, and a capacitor C3. In FIG. 3C, the basic clock buffer 50 has been redrawn in a more compact form, with the reference numerals retained from FIG. 3A.

In the tuning circuit 61, the inductor L1p is inserted between the power supply terminal Vcc and the first lead 51 of the resistor R3p; the inductor L1n is inserted between the power supply terminal Vcc and the first lead 52 of the resistor R3n; and the capacitor C3 is connected between the first lead 51 of the resistor R3p and the first lead 52 of the resistor R3n. The tuning circuit is a resonant circuit whose frequency is centered around the clock frequency at which the modified clock buffer 60 is expected to operate. As a result, the insertion of the tuning circuit 61 improves the high-frequency response at the clock frequency.

In a modification to the tuned means of the clock buffer 60 described above, the two inductors L1p and L1n may be inductively coupled. In yet another modification to the tuned means, the capacitor C3 may be replaced by two capacitors C3p and C3n, connected in parallel with the inductors L1p and L1n respectively. These modifications provide flexibility in the physical layout of the devices.

FIG. 3D shows the frequency response of the modified clock buffer 60 (solid line) and of the clock buffer 50 (dashed line). At low frequency up to a frequency of f1, there is no difference between the two curves. Above the frequency of f1, the response of the modified clock buffer 60 is reduced slightly, then increases again, to peak substantially at the frequency of f2. At the frequency of f2, the gain of the modified clock buffer 60 is higher than that of the (unmodified) clock buffer 50. As a result, the modified clock buffer 60 is capable of operating at a higher clock frequency than the clock buffer 50, given the same technology level.

In a further modification to the tunes means of the clock buffer 60, the capacitor C3 may be omitted entirely, the tuned means becoming an inductive means. In this case, the circuit becomes a wide band clock buffer with increased bandwidth relative to the clock buffer 50, but without exhibiting the peaking effect at a resonant frequency.

Figures 4A, 4B:
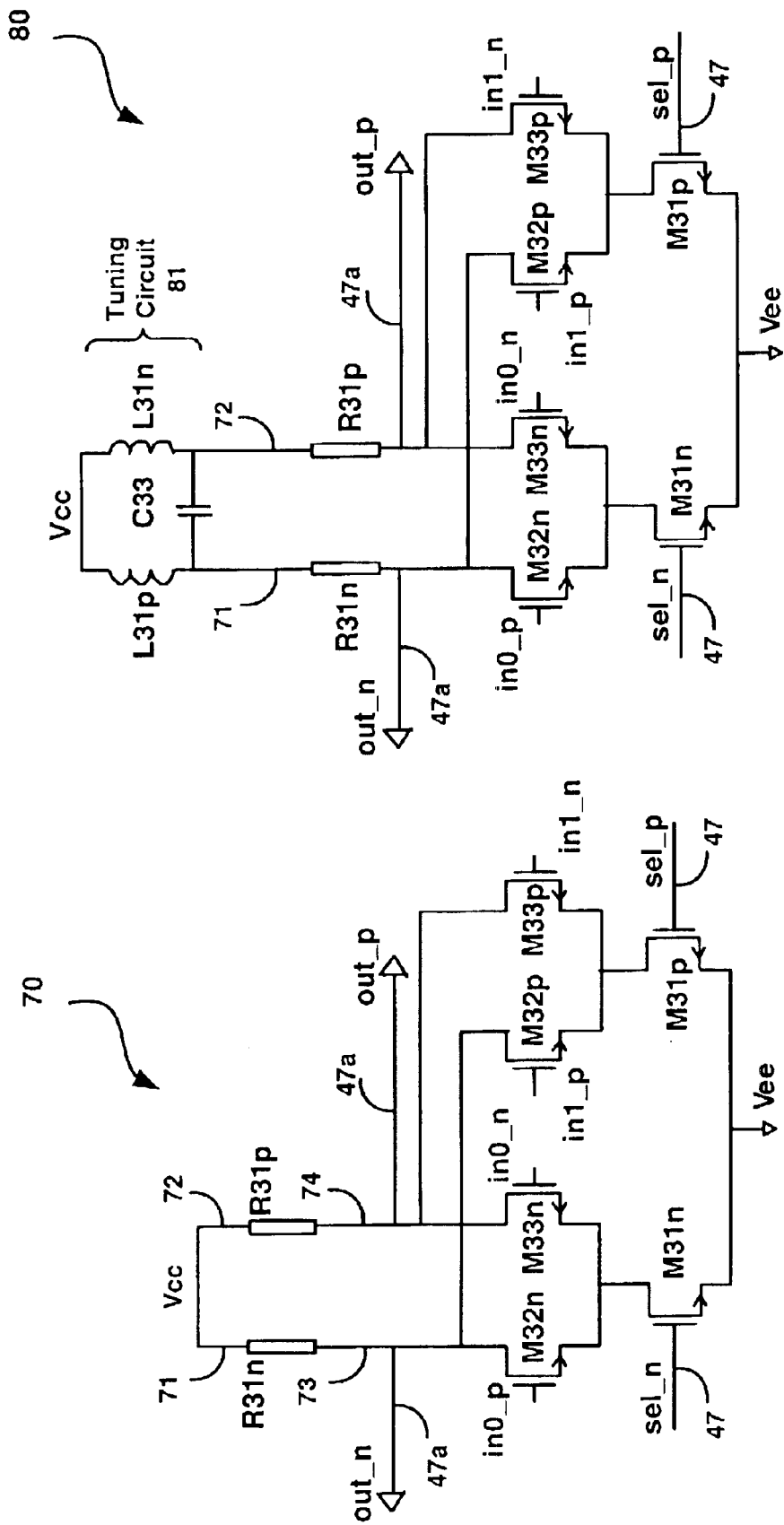
FIG. 4A shows a detailed circuit diagram of the QTL logic circuit of a first embodiment of the invention (a QTL multiplex circuit)
FIG. 4B shows a detailed circuit diagram of a modified QTL multiplex circuit of FIG. 4A.

FIG. 4A shows a detailed circuit diagram of the logic circuit 12 of the first embodiment of the invention, the logic circuit being a multiplex circuit 70. One or more multiplex circuits (Mux), having differential select inputs, first and second differential data inputs, and differential outputs, can provide required combinatorial logic functions. The multiplex circuit 70 has external connections to power supply terminals (Vcc and Vee); to a first pair of differential data input terminals (in0_n and in0_p); to a second pair of differential data input terminals (in1_n and in1_p); to a pair of differential select input terminals (se1_n and se1_p); and to a pair of differential data output terminals (out_n and out_p).

The multiplex circuit 70 comprises MOS transistors M31n, M31p, M32n, M32p, M33n, M33p and resistors R31n and R31p.

The power supply terminal Vcc is connected to a fust lead 71 of the resistor R31n and a first lead 72 of the resistor R31p. A second lead 73 of the resistor R31n is connected to the data output terminal out_n while a second lead 74 of the resistor R31p is connected to the data output terminal out_p. Further connected to the data output terminal out_n are the drains of the transistors M32n and M32p. The gate of the transistor M32n is connected to the data input terminal in0_p while the gate of the transistor M32p is connected to the data input terminal in 1_p. Further connected to the data output terminal out_p are the drains of the transistors M33n and M33p. The gate of the transistor M33n is connected to the data input terminal in0_n while the gate of the transistor M33p is connected to the data input terminal in1_n.

The sources of the transistors M32n and M33n are tied together and connected to the drain of the transistor M31n. The gate of the transistor M31n is connected to the select input terminal se1_n. The sources of the transistors M32p and M33p are tied together and connected to the drain of the transistor M31p. The gate of the transistor M31p is connected to the select input terminal se1_p. The sources of both the transistors M31n and M31p are connected to tie power supply terminal Vee.

The operation of the multiplex circuit 70 is that of a data selector. Under control of the differential select input (se1_n and se1_p), the differential data output (out_n and out_p) follows either the first differential data input (in0_p and in0_n) or the second differential data input (in 1_p and in1_n).

The source of the differential select input signal to the multiplex circuit 70 is either a clock buffer 50 or 60, or a data buffer (see FIG. 10 below). The source of the differential data input signals to the multiplex circuit 70 may be any other logic circuit (multiplex circuits 70 or circuits in FIGS. 4B and FIGS. 5–11).

In the case where the differential select input signal to the multiplex circuit 70 is supplied by a clock buffer 50 or 60, the operating current of the multiplex circuit 70 is controlled by scaling the device dimensions of the transistors M31n and M31p of the multiplex circuit 70 relative to the device dimensions of the transistors M1n and M1p in the clock buffer 50 or 60. The differential select input signal to the multiplex circuit 70 may also be supplied by a data buffer (see FIG. 10 below).

By using the self-biased clock buffer 50 or 60 (or a data buffer of FIG. 10), the operating current of the multiplex circuit 70 is controlled without the need for a tail current source. As a result, a greater voltage swing and higher speed can be achieved.

A modification to the multiplex circuit 70 of FIG. 4A is shown in FIG. 4B. The multiplexer circuit 80 of FIG. 4B comprises all components of the multiplex circuit 70, in addition to a tuned means including a resonant means, which comprise a tuning circuit 81 including inductors L31p and L31n, and a capacitor C33. The inductor L31p is inserted between the power supply terminal Vcc and the first lead 71 of the resistor R31n; the inductor L31n is inserted between the power supply terminal Vcc and the first lead 72 of the resistor R31p; and the capacitor C33 is connected between the first lead 71 of the resistor R31n and the first lead 72 of the resistor R31p.

The function and the operation of the tuning circuit 81 in the modified multiplex circuit 80, including further modifications to the tuned means, are analogous to those described with reference to the tuning circuit 61 of the modified clock buffer 60 above.

Figures 5A, 5B:
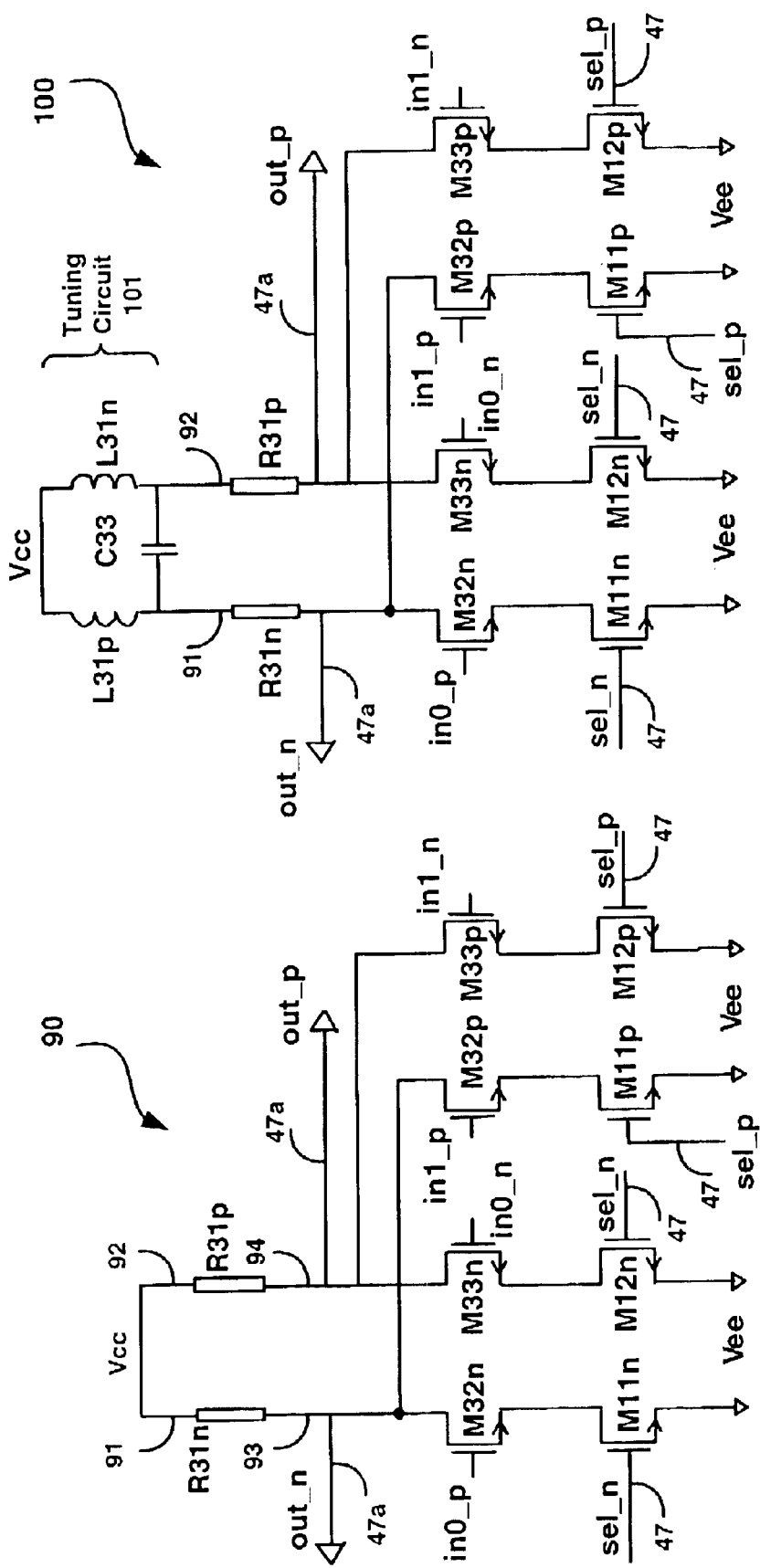
FIG. 5A shows a detailed circuit diagram of the QTL logic circuit of a second embodiment of the invention (a flexible QTL multiplex circuit)
FIG. 5B shows a detailed circuit diagram of a modified flexible QTL multiplex circuit of FIG. 5A.

FIG. 5A shows a detailed circuit diagram of the logic circuit 12 of the second embodiment of the invention, the logic circuit being a flexible multiplex circuit 90. The flexible multiplex circuit 90 differs from the multiplex circuit 70 in the following manner.

The transistor M31n of the multiplex circuit 70, connected to the joint sources of the transistors M32n and M33n is removed, and the sources of transistors M32n and M33n are no longer joined; instead two transistors M11n and M12n are inserted, the drain of the transistor M11n being connected to the source of the transistor M32n, and the drain of the transistor M12n being connected to the source of the transistor M33n. The gates of both the transistors M11n and M12n are joined and connected to the select input terminal se1_n. The sources of the transistors M11n and M12n are connected to the power supply terminal Vee.

In a similar fashion, the transistor M31p of the multiplex circuit 70, connected to the joint sources of the transistors M32p and M33p is removed, and the sources of transistors M32p and M33p are no longer joined; instead two transistors M11p and M12p are inserted, the drain of the transistor M11p being connected to the source of the transistor M32p, and the drain of the transistor M12p being connected to the source of the transistor M33p. The gates of both the transistors M11p and M12p are joined and connected to the select input terminal se1_p. The sources of the transistors M11p and M12p are connected to the power supply terminal Vee.

In effect, the single "select" transistors (M31n and M31p in the multiplex circuit 70) are split and replaced by two distinct transistors each (M11n and M12n, and M11p and M12p in the flexible multiplex circuit 90), without change in the functionality of the multiplex circuit as a whole.

The multiplex circuit 70 may be described in an alternative manner as follows. The circuit 70 comprises an upper group of two transistor pairs, the transistors M32n and M32p forming a left pair of the upper group, and the transistors M33n and M33p forming a right pair of the upper group; and a lower group of two transistor pairs, the transistors M11n and M11p forming a left pair of the lower group, and the transistors M12n and M12p forming a right pair of the lower group. The sources of the transistors in the lower group are connected to the first power supply terminal (Vee). The drains of the transistors in the lower group are connected to the sources of the corresponding transistors in the upper group. The drains of the transistors (M32n and M32p) of the left pair in the upper group are connected to a first lead of a load element (the resistor R31n) whose second lead is connected to the second power supply terminal (Vcc). The drains of the transistors (M33n and M33p) of the right pair in the upper group are connected to a first lead of another load element (the resistor R31p) whose second lead is connected to the second power supply terminal (Vcc). The drains of the transistors of the left and right pairs in the upper group provide the differential output of the flexible logic circuit (out_n and out_p respectively). The gates of the transistors in the upper group provide the differential data inputs, the transistors in the left pair providing the positive inputs in0_p (M32n), and in 1_p (M32p), and the transistors in the right pair providing the negative inputs in0_n (M33n), and in1_n (M33p). The transistors in the lower group provide the differential select input, the negative select input sel_n provided by the gates of the transistors M11n and M12n, and the positive select input sel_p provided by the gates of the transistors M11p and M12p.

In the case where the differential select input signal to the flexible multiplex circuit 90 is supplied by a clock buffer 50 or 60, the operating current of the flexible multiplex circuit 90 is controlled by scaling the device dimensions of the transistors M11n, M12n, M11p, and M12p in the multiplex circuit 90 relative to the device dimensions of the transistors M1n and M1p in the clock buffer 50 or 60. The differential select input signal to the flexible multiplex circuit 90 may also be supplied by a data buffer (see FIG. 10 below).

FIG. 5B shows a detailed circuit diagram 100 of a modified flexible QTL multiplex circuit of FIG. 5A. The modified multiplex circuit 100 shown in FIG. 5B comprises all components of the flexible multiplex circuit 90, in addition to a tuning circuit 101 (tuning means) including inductors L31p and L31n, and a capacitor C33. The inductor L31p is inserted between the power supply terminal Vcc and the first lead 91 of the resistor R31n; the inductor L31n is inserted between the power supply terminal Vcc and the first lead 92 of the resistor R31p; and the capacitor C33 is connected between the first lead 91 of the resistor R31n and the first lead 92 of the resistor R31p.

The function and the operation of the tuning circuit 101 in the modified flexible multiplex circuit 100, including further modifications to the tuning circuit, are analogous to those described with reference to the tuning circuit 61 of the modified clock buffer 60 above.

Figures 6A, 6B:
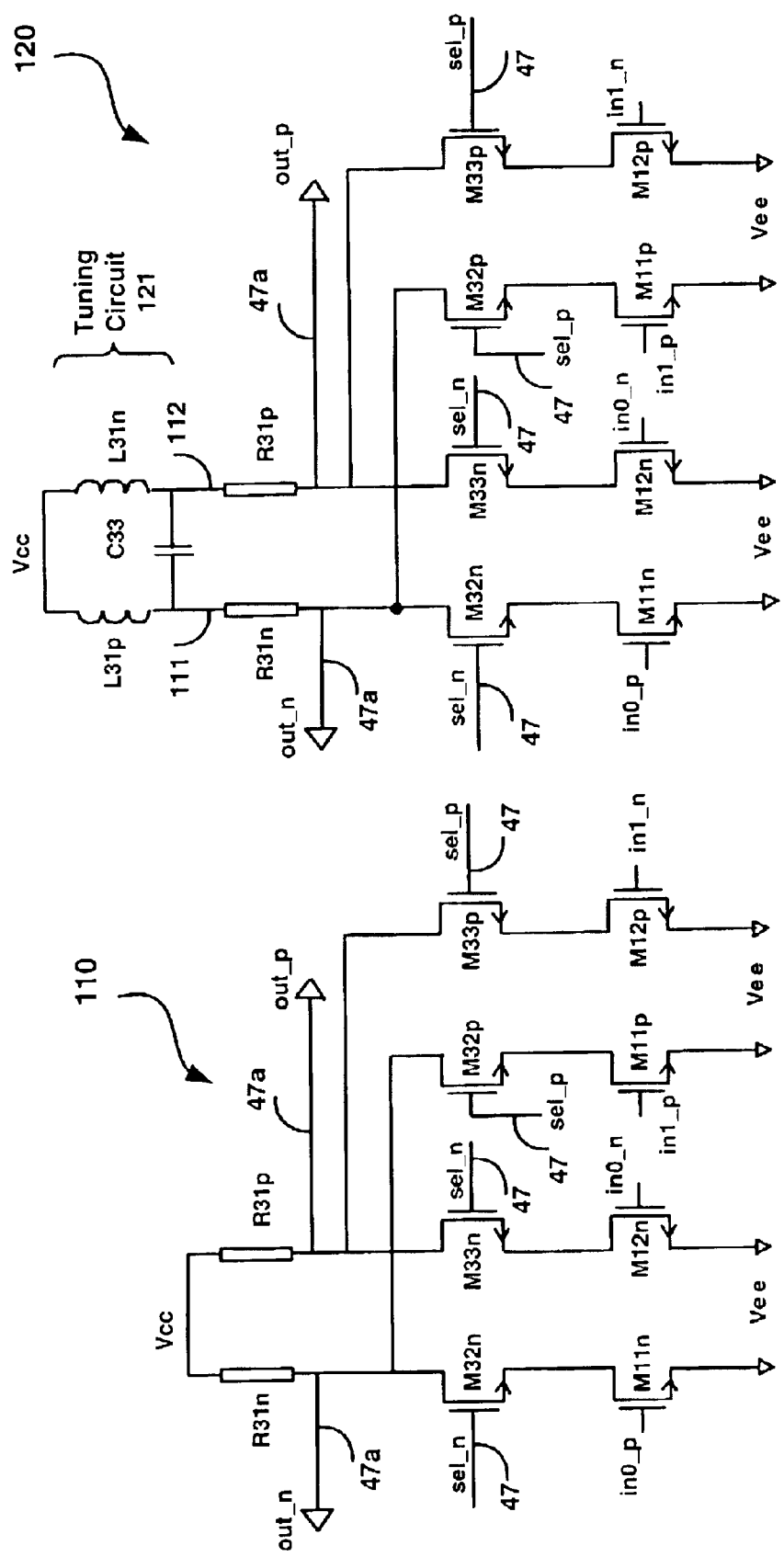
FIG. 6A shows a detailed circuit diagram of another modification to the flexible QTL multiplex circuit of FIG. 5A.
FIG. 6B shows a detailed circuit diagram of a modification to the flexible QTL multiplex circuit of FIG. 5B.

FIG. 6A shows a detailed circuit diagram of another modification to the flexible multiplex circuit 90 of FIG. 5A. This modified multiplex circuit 110 shown in FIG. 6A differs from the flexible multiplex circuit 90 in the connections of the data input and select terminals to the circuitry. Whereas the data input terminals in0_p, in0_n, in1_p, and in 1_p are connected to the gates of the transistors M32n, M33n, M32p, and M33p in the flexible multiplex circuit 90, these data input terminals are connected to the gates of the transistors M11n, M12n, M11p, and M12p in the modified circuit 110. Conversely, the select terminals sel_n and sel_p (connected to the gates of the transistors M11n and M12n, and M11p and M12p respectively in the flexible multiplex circuit 90) are connected to the gates of the transistors M32n and M33n, and M32p and M33p respectively in the modified circuit 110.

The logic functionality of the two circuits shown in FIGS. 6A and 6B does not differ from each other. However, there is a difference in the propagation delay from an input (data input or select input) to the output.

In the flexible multiplex circuit 90, the propagation delay from the data inputs (in0_p, in0_n, in1_p, in1_n) to the data outputs (out_n, out_p) is less than the delay from the select inputs (sel_n, sel_p). This is due to the fact that (in circuit 90) there is only a single transistor between a data input and a data output (e.g. from the terminal in0_p, through the gate of M32n and the drain of M32n, to the terminal out_n). On the other hand, the path from a select input to a data output contains two transistors (e.g. from the terminal sel_n, through the gate of M11n, the drain of M11n, the source of M32n, the drain of M32n, to the terminal out_n). In the circuit 110, the reverse is true, and the delay from the select inputs (sel_n, sel_p) to the data outputs (out_n, out_p) is less than the delay from the data inputs (in0_p, in0_n, in1_p, in1_n).

Depending on the application of the flexible multiplex circuit, the circuit 90 may be chosen where the delay from the data inputs is most critical. Alternatively, circuit 110 may be chosen if the delay from the select inputs is more critical.

Yet another modification to the flexible multiplex circuit 110 of FIG. 6A is shown in FIG. 6B. The modified multiplex circuit 120 shown in FIG. 6B comprises all components of the flexible multiplex circuit 110, in addition to a tuning circuit 121 (tuned means) including inductors L31p and L31n, and a capacitor C33. The inductor L31p is inserted between the power supply terminal Vcc and the first lead 111 of the resistor R31n; the inductor L31n is inserted between the power supply terminal Vcc and the first lead 112 of the resistor R31p; and the capacitor C33 is connected between the first lead 111 of the resistor R31n and the first lead 112 of the resistor R31p.

The function and the operation of the tuning circuit 121 in the modified flexible multiplex circuit 120, including further modifications to the tuned means, are analogous to those described with reference to the tuning circuit 61 of the modified clock buffer 60 above.

Figures 7A, 7B:
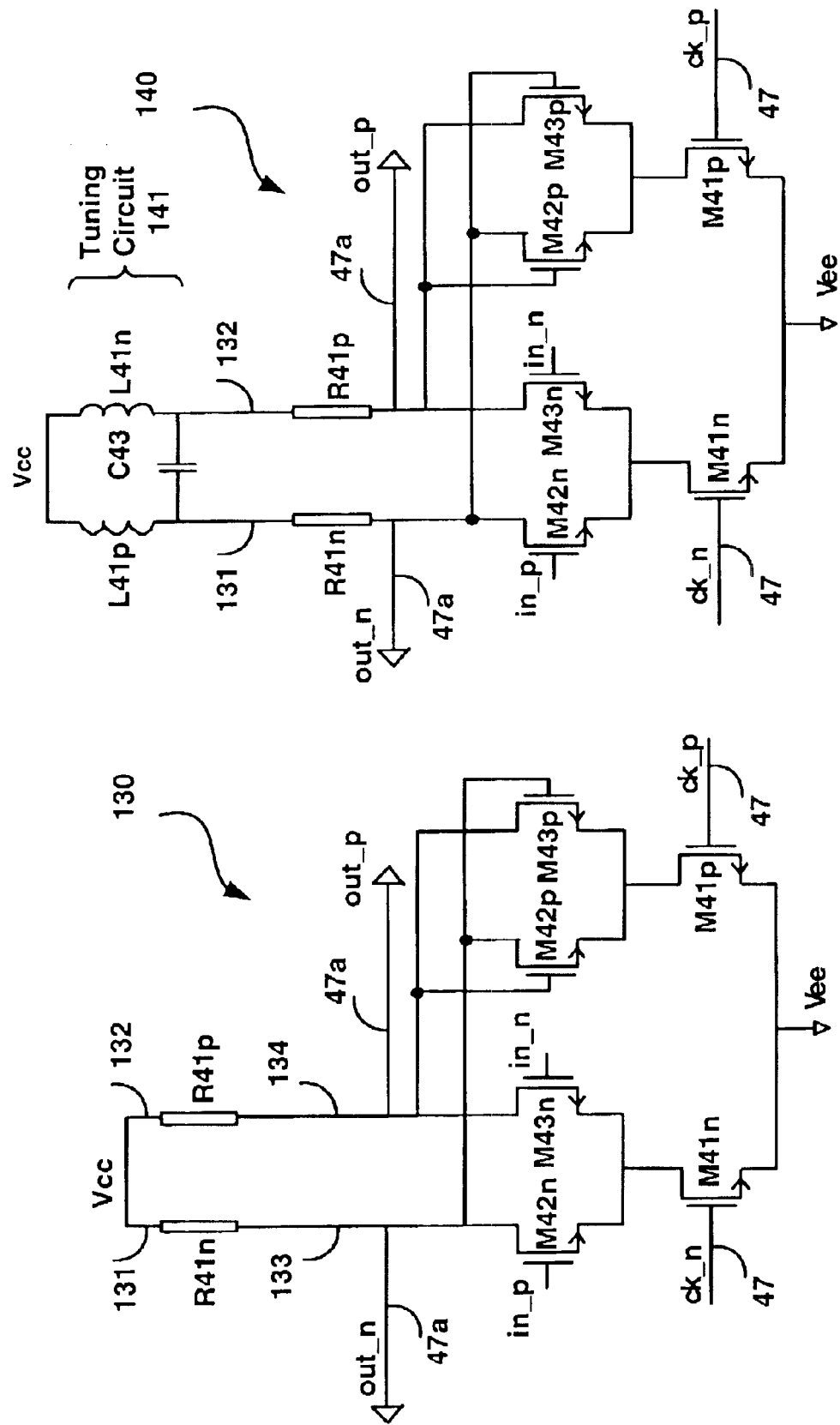
FIG. 7A shows a detailed circuit diagram of the QTL logic circuit of a third embodiment of the invention (a QTL latch circuit)
FIG. 7B shows a detailed circuit diagram of a modified QTL latch circuit of FIG. 7A.

FIG. 7A shows a detailed circuit diagram of the logic circuit of the third embodiment of the invention, the logic circuit being a latch circuit 130. The latch circuit 130 is similar to the multiplex circuit 70 and includes similar circuit elements, but connected differently.

The latch circuit 130 has external connections to power supply terminals (Vcc and Vee); to a pair of differential data input terminals (in_n and in_p); to a pair of differential clock input terminals (ck_n and ck_p); and to a pair of differential data output terminals (out_n and out_p). The latch circuit 130 comprises MOS transistors M41n, M41p, M42n, M42p, M43n, M43p and resistors R41n and R41p.

The power supply terminal Vcc is connected to a first lead 131 of the resistor R41n and a first lead 132 of the resistor R41p. A second lead 133 of the resistor R41n is connected to the data output terminal out_n while a second lead 134 of the resistor R41p is connected to the data output terminal out_p. Further connected to the data output terminal out_n are the drains of the transistors M42n and M42p, and the gate of the transistor M43p. The gate of the transistor M42n is connected to the data input terminal in_p. Further connected to the data output terminal out_p are the drains of the transistors M43n and M43p, and the gate of the transistor M42p. The gate of the transistor M43n is connected to the data input terminal in_n.

The sources of the transistors M42n and M43n are tied together and connected to the drain of the transistor M41n. The gate of the transistor M41n is connected to the clock input terminal ck_n. The sources of the transistors M42p and M43p are tied together and connected to the drain of the transistor M41p. The gate of the transistor M41p is connected to the clock input terminal ck_p. The sources of both the transistors M41n and M41p are connected to the power supply terminal Vee.

The logical operation of the latch circuit 130 is that of a conventional latch circuit: the value of the signal at the differential inputs in_n and in_p are transferred to the differential outputs out_n and out_p upon activation of the differential clock inputs ck_n and ck_p. Upon de-activation of the differential clock inputs ck_n and ck_p, the latch retains the output value due to the cross-coupling between the outputs out_p and out_n, and the bases of the transistors M42p and M43p respectively.

The source of the differential clock input signal to the latch circuit 130 is either a clock buffer 50 or 60, or a data buffer (see FIG. 10 below). The source of the differential data input signals to the latch circuit 130 may be any other logic circuit, e.g. circuits shown in FIGS. 3–11.

In the case where the differential clock input signal to the latch circuit 130 is supplied by a clock buffer 50 or 60, the operating current of the latch circuit 130 is controlled by scaling the device dimensions of the transistors M41n and M41p of the latch circuit 130 relative to the device dimensions of the transistors M1n and M1p in the clock buffer 50 or 60. The differential select input signal to the latch circuit 130 may also be supplied by a data buffer (see FIG. 10 below).

By using the self-biased clock buffer 50 or 60 (or a data buffer of FIG. 10), the operating current of the latch circuit 130 is controlled without the need for a tail current source. As a result, a greater voltage swing and higher speed can be achieved with the latch circuit 130.

A modification to the latch circuit 130 is shown in FIG. 7B. The modified latch circuit 140 shown in FIG. 7B comprises all components of the latch circuit 130, in addition to a tuning circuit 141 (tuned means) including inductors L41p and L41n, and a capacitor C43. The inductor L41p is inserted between the power supply terminal Vcc and the first lead 131 of the resistor R41n; the inductor L41n is inserted between the power supply terminal Vcc and the first lead 132 of the resistor R41p; and the capacitor C43 is connected between the first lead 131 of the resistor R41n and the first lead 132 of the resistor R41p.

The function and the operation of the tuning circuit 141 in the modified latch circuit 140, including further variations of the tuned means, are analogous to those described with reference to the tuning circuit 61 of the modified clock buffer 60 above.

Figures 8A, 8B:
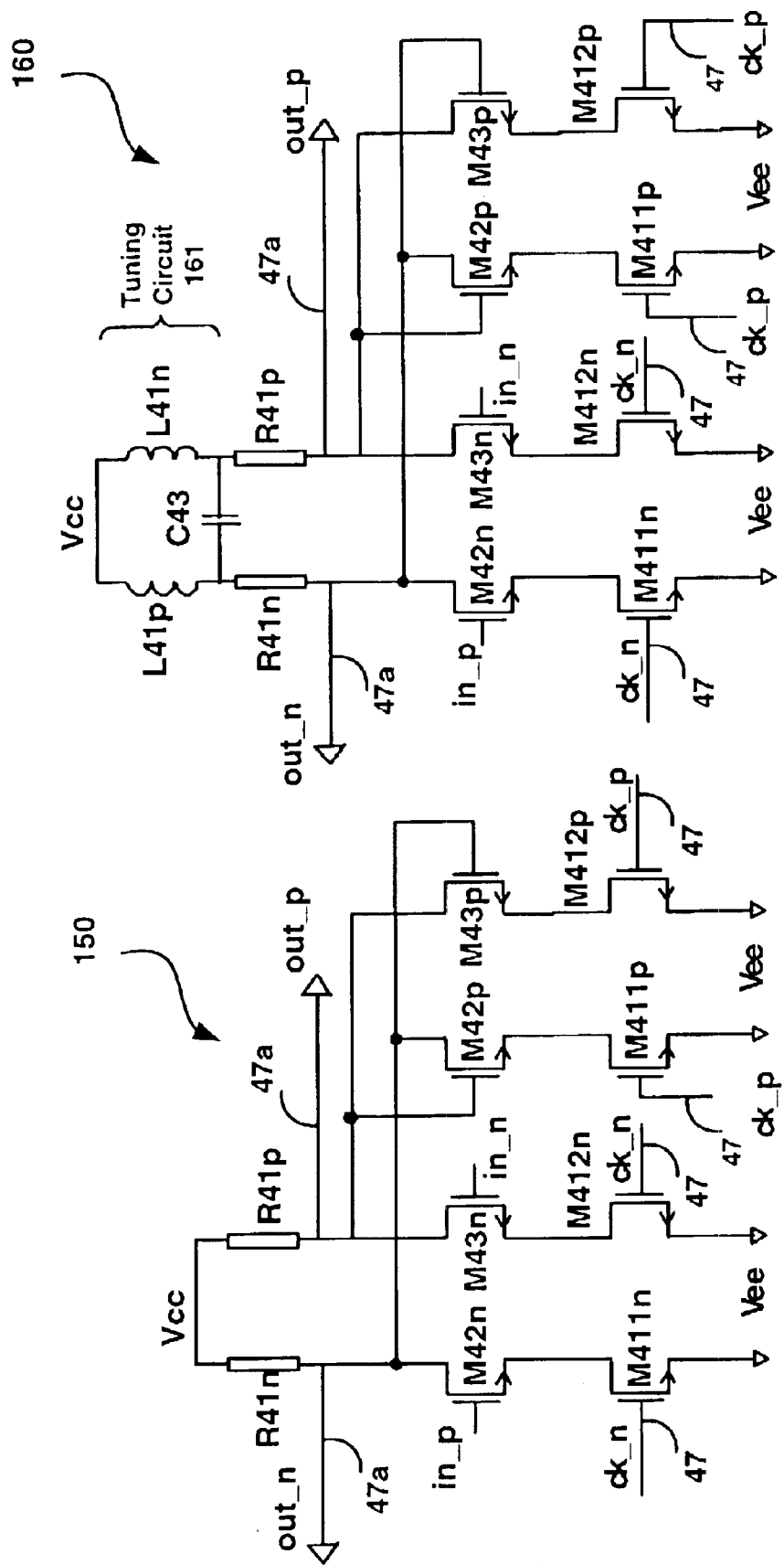
FIG. 8A shows a detailed circuit diagram of the QTL logic circuit of a fourth embodiment of the invention (a flexible QTL latch circuit)
FIG. 8B shows a detailed circuit diagram of a modified flexible QTL latch circuit of FIG. 8A.

FIG. 8A shows a detailed circuit diagram of the QTL logic circuit of the third embodiment of the invention, the logic circuit being a flexible latch circuit 150. The latch circuit 150 is a modification to the latch circuit 130 of FIG. 7A, which differs from the circuit 130 in that the transistors M41n and M41p of the circuit 130 have been split into separate transistors M41n and M412n, and M411p and M412p in the circuit 150; the sources of the transistors M42n and M43n are connected to the drains of the transistors M411n and M412n respectively in the circuit 150. Similarly, the sources of transistors M42p and M43p are connected to the drains of the transistors M411p and M412p respectively in the circuit 150.

FIG. 8B shows a detailed circuit diagram 160 of a modified flexible latch circuit of FIG. 8A. The modified latch 160 of FIG. 8B differs from the latch circuit 150 of FIG. 8A by the addition of a tuning circuit 161 (L41p, L41n, C43). The purpose and operation of the tuning circuit was described in detail above with reference to FIG. 4B.

Figures 9A, 9B:
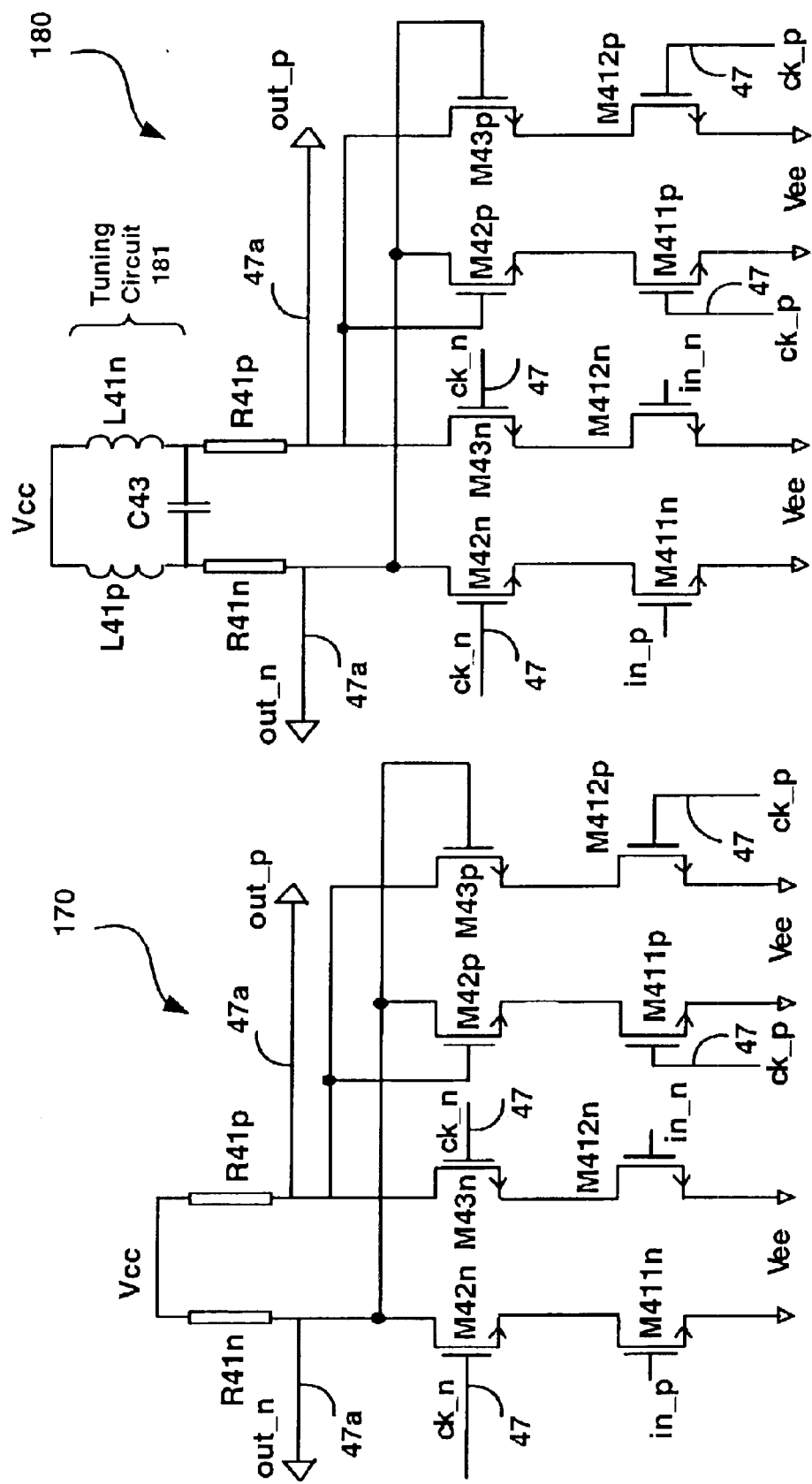
FIG. 9A shows a detailed circuit diagram of another modification to the flexible QTL latch circuit of FIG. 8A.
FIG. 9B shows a detailed circuit diagram of a modification to the flexible QTL latch circuit of FIG. 8B.

FIG. 9A shows a detailed circuit diagram 170 of another modification to the flexible latch circuit 150 of FIG. 8A. The latch circuit 170 of FIG. 9A differs from the circuit 150 of FIG. 8A in the placement of the clock inputs (ck_n and ck_p) and the data inputs (in n and in_p). The clock input ck_n is connected to the gates of the transistors M42n and M43n; the clock input ck_p is connected to the gates of the transistors M411p and M412p; and the data inputs in_n and in_p are connected to the gates of the transistors M412n and M411n respectively.

The flexible latch circuit 150 and 170 are structurally identical, but permit the application designer to choose one or the other, based on propagation delay considerations, as has been described above with reference to FIG. 6A.

FIG. 9B shows a detailed circuit diagram 180 of modification to the flexible latch circuit of FIG. 8B. This modified latch circuit 180 of FIG. 9B differs from the circuit 170 of FIG. 9A by the addition of a tuning circuit 181 (L41p, L41n, C43). The purpose of the tuning circuit was described in detail above with reference to FIG. 4B.

Figures 10A, 10B:
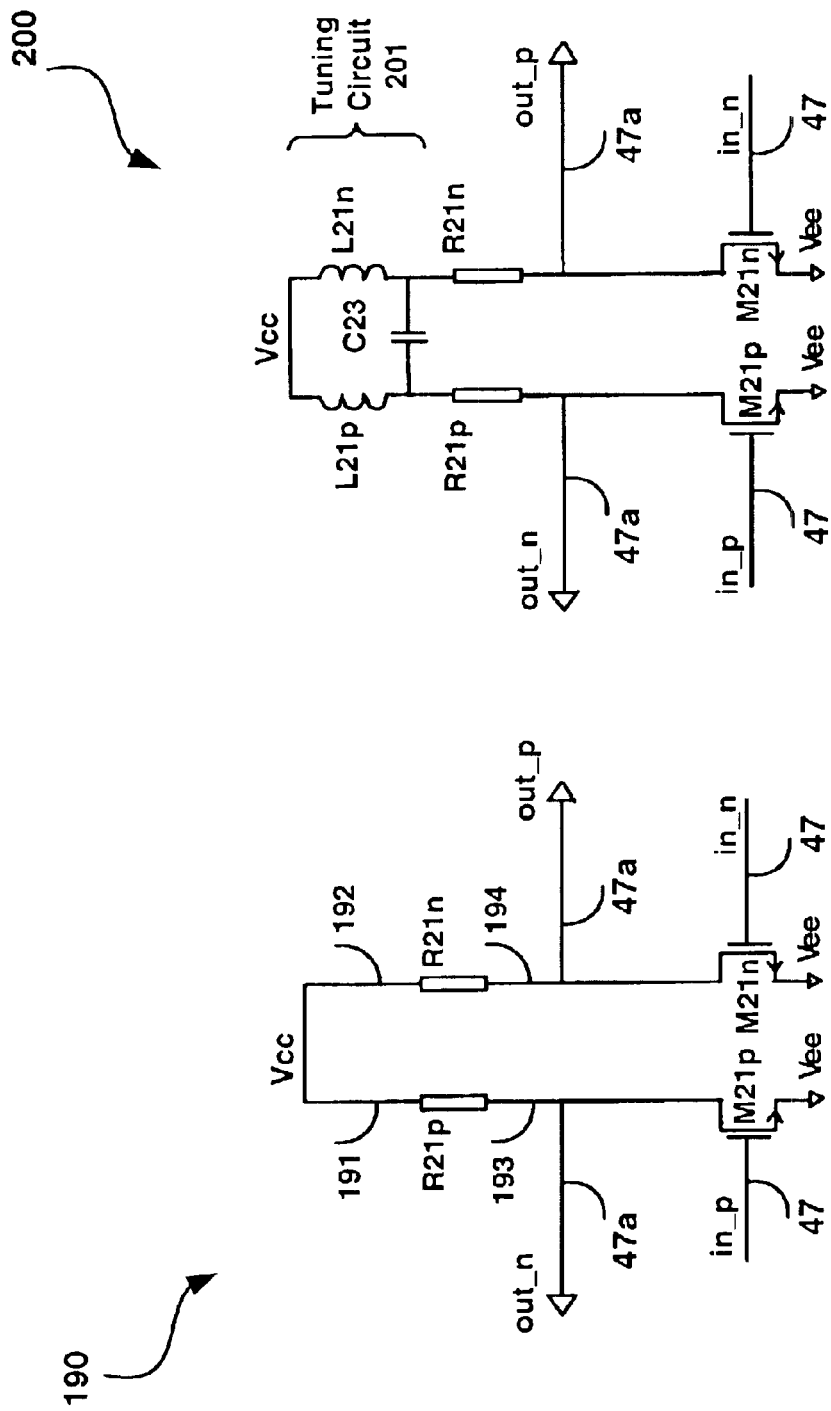
FIG. 10A shows a detailed circuit diagram of the QTL logic circuit of a fifth embodiment of the invention (a QTL data buffer circuit)
FIG. 10B shows a detailed circuit diagram of a modified QTL data buffer of FIG. 10A.

FIG. 10A shows a detailed circuit diagram of the logic circuit of the fifth embodiment of the invention, the logic circuit being a data buffer 190. The data buffers may be used for signal distribution (clock or data) where the signal is connected to many other blocks, for introducing small signal delays, and as power gain blocks between stages.

The data buffer 190 has external connections to power supply terminals (Vcc and Vee); to a pair of differential data input terminals (in_p and in_n); and to a pair of differential data output terminals (out_n and out_p). The data buffer 190 comprises MOS transistors M21p and M21n, and resistors R21p and R21n.

The power supply terminal Vcc is connected to a first lead 191 of the resistor R21p and a first lead 192 of the resistor R21n. A second lead 193 of the resistor R21p is connected to the data output terminal out_n while a second lead 194 of the resistor R21n is connected to the data output terminal out_p. Further connected to the data output terminal out_n is the drain of the transistor M21p. The gate of the transistor M21p is connected to the data input terminal in_p. Also connected to the data output terminal out_p is the drain of the transistor M21n. The gate of the transistor M21n is connected to the data input terminal in_n.

The sources of both the transistors M21n and M21_p are connected to the power supply terminal Vee.

The logical operation of the data buffer 190 is that of a simple buffer or logic inverter, depending on the external interconnections.

When driven by a self-biased clock buffer (50 or 60), the data buffer's operating current and output voltage swing are controlled by scaling the device dimensions of the transistors M21n and M21p in the circuit 190 relative to the device dimensions of the transistors M1n and M1p in the clock buffer 50 or 60.

FIG. 10B shows a detailed circuit diagram of a modified data buffer 200. This modification differs from the circuit 190 of FIG. 10A by the addition of a tuning circuit 201 (L21p, L21n, C23).

The function and the operation of the tuning circuit 201 in the modified data buffer 200, including further modifications to the tuning circuit, are analogous to those described with reference to the tuning circuit 61 of the modified clock buffer 60 above.

FIGS. 11A, 11C and 11D show logical symbols for the QTL clock buffer of FIG. 3 and for the QTL data buffer of FIG. 10; for the QTL multiplex circuit of FIGS. 4 to 6; and for the QTL latch circuits of FIGS. 7 to 9. The logical symbols provide names for input and output terminals without showing the power supply terminals.

In designing more complex logic circuitry including a number of blocks, it is convenient to use the logical symbols of FIGS. 11A, 11C, and 11D, to diagram the logic functionality without showing the details of the circuit at the transistor level. A number of examples of such logic blocks are provided in FIGS. 12, 13, and 14 below.

FIG. 11B shows a table of signals 212 providing a correspondence of the signal names used in the logic symbol 210 of FIG. 11A with the circuit terminal names used in the circuit diagrams of FIGS. 3 and 10.

The input and output signals are differential, represented as "signal_p" and "signal_n" (actual signals), or just "signal" (logical signal), where "signal" stands for "in", "out", "ck" etc. as applicable. For differential signals, the logical levels are "1" when Voltage(signal1_p)>Voltage(signal1_n), and "0" otherwise.

The logical operation of a circuit represented by the logic symbol 210 is as follows:

out=in.

In FIG. 11C, the logic symbol 220 is used to depict any embodiment of a QTL multiplex circuit 70, 80, 90, 100, 110, or 120.

The logical operation of the circuit represented by the logic symbol 220 is as follows:

if se1=0 then out=in0, if se1=1 then out=in1.

In FIG. 11D, the logic symbol 230 is used to depict any embodiment of a QTL latch circuit 130, 140, 150, 160, 170, or 180.

The logical operation of a circuit represented by the logic symbol 230 is as follows:

if ck=0 then out=in, latch is transparent, if ck=1 then out holds the value from before the transition.

Figure 12:
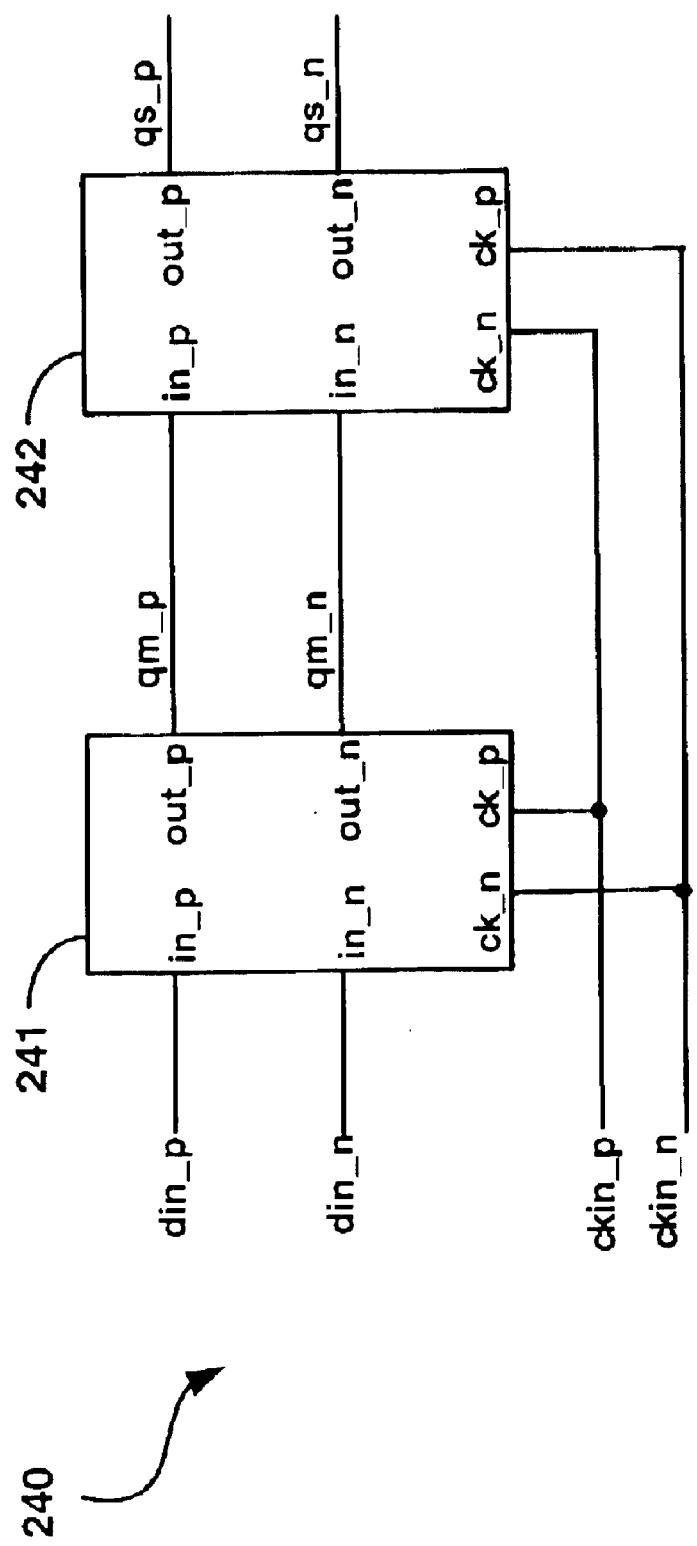
FIG. 12 shows a block diagram of a D-type flip-flop using the QTL latch circuits of FIGS. 7 to 9.

FIG. 12 shows a block diagram of a D-type flip-flop 240 using the QTL latch circuits of FIGS. 7 to 9. A D-type flip-flop is an edge sensitive storage device having a data input, a clock input, and a data output. The D-type flip-flop stores the logic value (0 or 1) that is present at the data input at the moment when the clock input changes from a 0 to a 1 logic value (or 1 to 0 transition).

The D-type flip-flop 240 (also termed a master-slave flip-flop) is constructed from first and second latch circuits 241 (master) and 242 (slave). Latch circuits 241 and 242 are represented by logic symbols 230 (see FIG. 11D), and may be embodied by any of the latch circuits described in FIGS. 7–9.

The D-type flip-flop 240 is connected externally to differential data input terminals din_p and din_n; to clock input terminals ckin_p and ckin_n; and to data output terminals dout_p and dout_n.

The data input terminals din_p and din_n are connected to the inputs in_p and in_n respectively of latch circuit 241. The clock input terminal ckin_p is connected to the input ck_p of latch circuit 241, and to the input ck_n of latch circuit 242. The clock input terminal ckin_n is connected to the input ck_n of latch circuit 241, and to the input ck_p of latch 30 circuit 242. The outputs out_p and out_n of latch circuit 241 (signals labeled qm_p and qm_n) are connected to the inputs in_p and in_n respectively of the latch circuit 242. The outputs of the latch circuit 242 are connected to the output terminals qs_p and qs_n.

The D-type flip-flop 240 operates in a traditional manner: during the logic 0 state of the clock signal, the output of the first latch circuit (241) follows the value of the data input signal. After the transition of the clock signal to the logic 1 state, the first latch circuit (241) "latches" the signal, i.e. retains the data value that was present at its input just prior to the transition, and outputs it on the intermediate signals qm_p and qm_n. During the period the clock signal is in the 1 state, the output of the second latch circuit (242) follows the value of the intermediate signals qm_p and qm_n which is now steady (latched by circuit 241). When the clock signal next changes back to logic 0, the latch circuit 242 latches the present signal value, continuing to output the value received from the first latch (241) via signals qm_p and qm_n since the last 0–1 transition of the clock signal. The effect is that the only time the output of the latch circuit 242, and hence the output of the D-type flip-flop 240 as a whole, can change is after a 0–1 transition of the clock signal. The logic value of the output of the D-type flip-flop 240 is the logic value that was present at its input just immediately to the most recent 0–1 transition of the clock signal.

Figure 13:
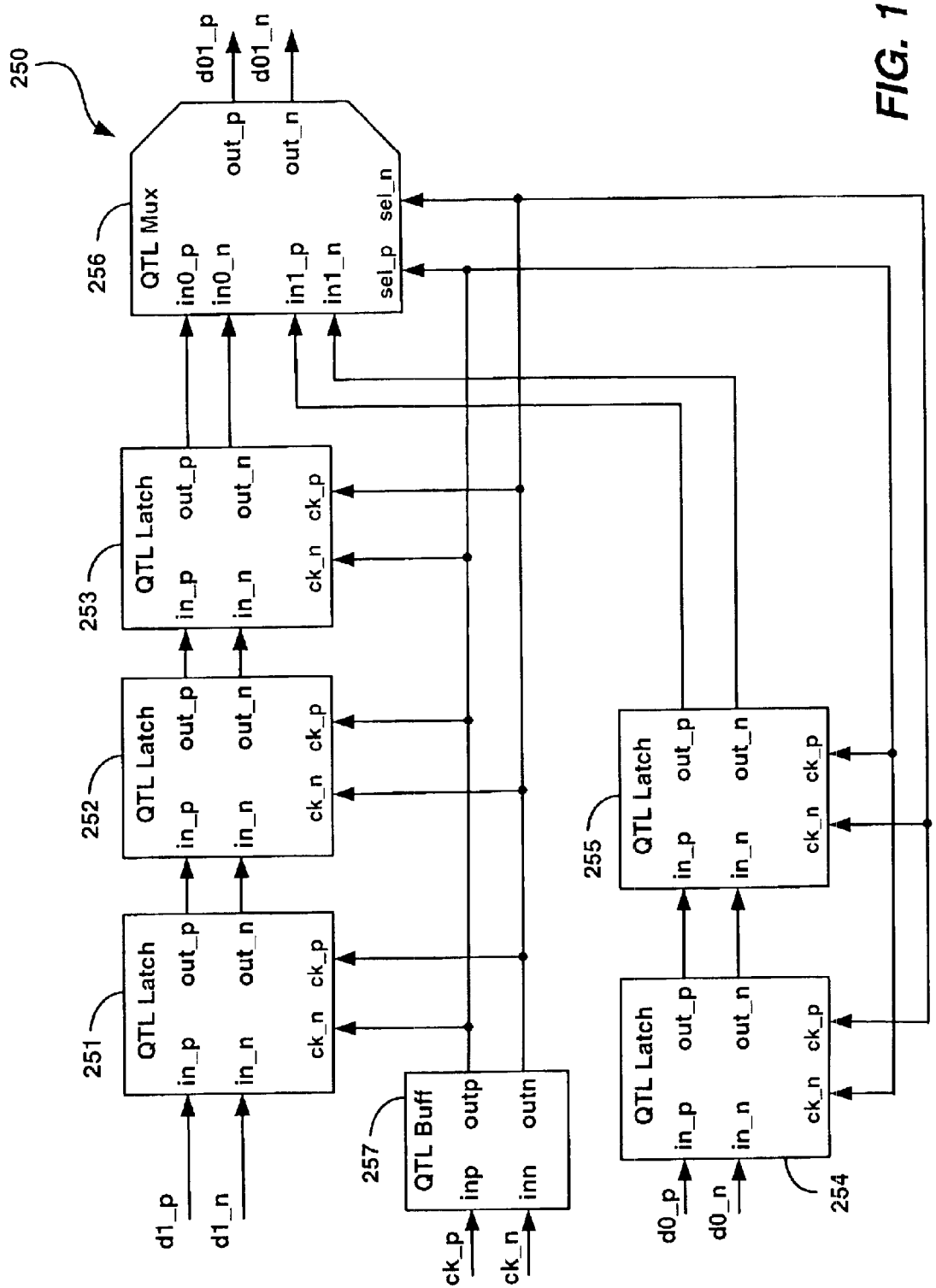
FIG. 13 shows a block diagram of a serializer circuit using QTL logic circuits of FIGS. 3 to 10.

FIG. 13 shows a block diagram of a serializer circuit 250 using logic circuits of FIGS. 3 to 10 and logic symbols of FIG. 11. The serializer 250 comprises five QTL Latches 251, 252, 253, 254, and 255; a QTL Mux 256; and a QTL Buffer 257. Not shown in FIG. 13 are additional clock and data buffers which may be required if the signal loading is too high.

The serializer 250 has external differential data input terminals d1_p, d1_n, d0_p, d0_n; external differential clock terminals ck_p and ck_n; and external differential data output terminals d01_p and d01_n.

The differential data input terminals d1_p and d1_n are connected to the data inputs of the QTL latch 251 (inp and inn). The differential data input terminals d0_p and d0_n are connected to the data inputs of the QTL latch 254 (inp and inn). The external differential clock terminals ck_p and ck_n are connected to the inputs of the QTL buffer 257 (inp and inn). The data outputs of the QTL Mux 256 are connected to the external differential data output terminals d01_p and d01_n.

The outputs of the QTL Buffer 257 are connected to the clock inputs of all QTL latches 251–255, and to the select inputs of the QTL Mux 256. More specifically, the positive output "outp" of the QTL Buffer 257 is connected to the negative clock inputs of the QTL Latches 251, 253, and 254 "ckn", the positive clock inputs "ckp" of the QTL Latches 252 and 255, and to the positive select input "se1p" of the QTL Mux 256; the negative output "outn" of the QTL Buffer 257 is connected to the positive clock inputs of the QTL Latches 251, 253, and 254 "ckp", the negative clock inputs "ckn" of the QTL Latches 252 and 255, and to the negative select input "se1n" of the QTL Mux 256.

The data outputs (outp and outn) of the QTL Latch 251 are connected to the data inputs (inp and inn) of the QTL Latch 252. The data outputs (outp and outn) of the QTL Latch 252 are connected to the data inputs (inp and inn) of the QTL Latch 253. The data outputs (outp and outn) of the QTL Latch 253 are connected to the data inputs (in0p and in0n) of the QTL Mux 256.

The data outputs (outp and outn) of the QTL Latch 254 are connected to the data inputs (inp and inn) of the QTL Latch 255. The data outputs (outp and outn) of the QTL Latch 255 are connected to the data inputs (inp and inn) of the QTL Mux 256.

The serializer 250 operates in a known manner. The external data inputs (d0 and d1) and the input clock (ck) are at the same rate. The output signal d01 is at double the rate of the input rate. This serializer thus performs the function of a 2:1 serializer. Higher orders of serializers, for example n:1, can be implemented by cascading a number of 2:1 serializers in a pyramid structure, as is well know to people skilled in the art.

Figure 14:
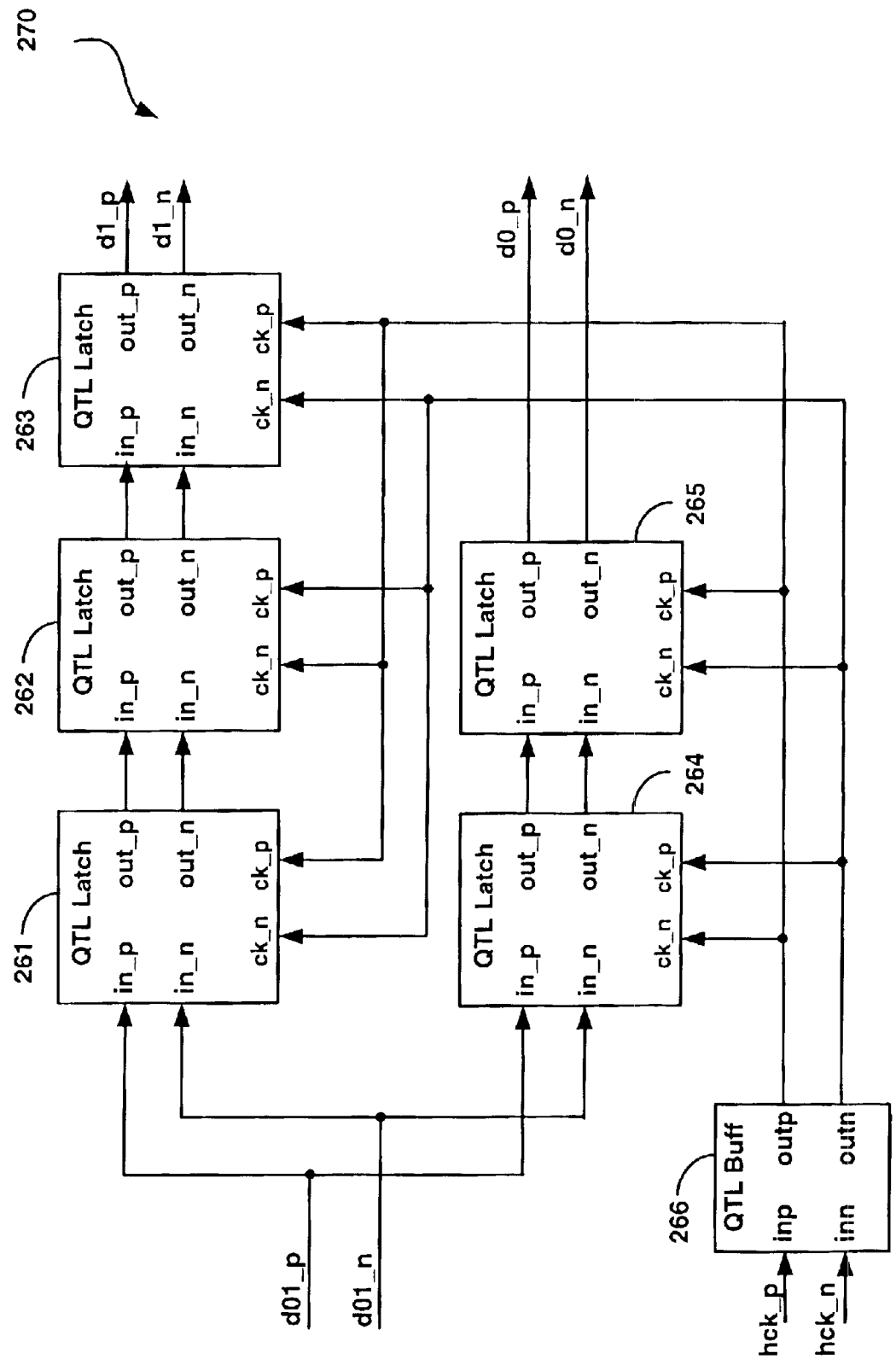
FIG. 14 shows a block diagram of a deserializer circuit using QTL logic circuits of FIGS. 3 to 10.

FIG. 14 shows a block diagram of a deserializer circuit 260 using logic circuits of FIGS. 3 to 10, and logic symbols from FIG. 11. The deserializer 260 comprises five QTL Latches 261, 262, 263, 264, and 265; and a QTL Buffer 266. Not shown in FIG. 14 are additional clock and data buffers which may be required if the signal loading is too high.

The deserializer 260 has external differential data input terminals d01_p and d01_n, external differential clock terminals hck_p and hck_n; and external differential data output terminals d1_p, d1_n, d0_p, and d0_n.

The differential data input terminals d01_p and d01_n are connected to the data inputs of the QTL latch 261 (inp and inn), as well as the data inputs of the QTL latch 264 (inp and inn). The external differential clock terminals hck_p and hck_n are connected to the inputs of the QTL buffer 266 (inp and inn). The data outputs of the QTL Latch 263 are connected to the external differential data output terminals d1_p and d1_n; and the data outputs of the QTL Latch 265 are connected to the external differential data output terminals d0_p and d0_n.

The outputs of the QTL Buffer 266 are connected to the clock inputs of all QTL latches 261–265. More specifically, the positive output "outp" of the QTL Buffer 266 is connected to the negative clock inputs of the QTL Latches 262 and 264 "ckn", and to the positive clock inputs "ckp" of the QTL Latches 261, 263, and 265; the negative output "outn" of the QTL Buffer 266 is connected to the positive clock inputs of the QTL Latches 262 and 264 "ckp", and to the negative clock inputs "ckn" of the QTL Latches 261, 263, and 265.

The data outputs (outp and outn) of the QTL Latch 261 are connected to the data inputs (inp and inn) of the QTL Latch 262. The data outputs (outp and outn) of the QTL Latch 262 are connected to the data inputs (inp and inn) of the QTL Latch 263. The data outputs (outp and outn) of the QTL Latch 264 are connected to the data inputs (in0p and in0n) of the QTL Latch 265.

The deserializer 260 operates in a known manner. The rate of the input clock (hck) is half that of the rate of the external data input (d01). The external output data (d1 and d0) are at half the rate of the external data input (d01), and are time aligned. This descrializer thus performs the function of a 1:2 deserializer. Higher orders of de-serializers, for example 1:n, can be implemented by cascading a number of 1:2 deserializers in a pyramid structure, as is well know to people skilled in the art.

Further instances of logic blocks that may conveniently be designed in a known manner by using the logic circuits of the embodiments of the invention and depicted by the logical symbols of FIGS. 11A, 11C, and 11D, are clock dividers and phase detectors (not shown).

Figure 15:
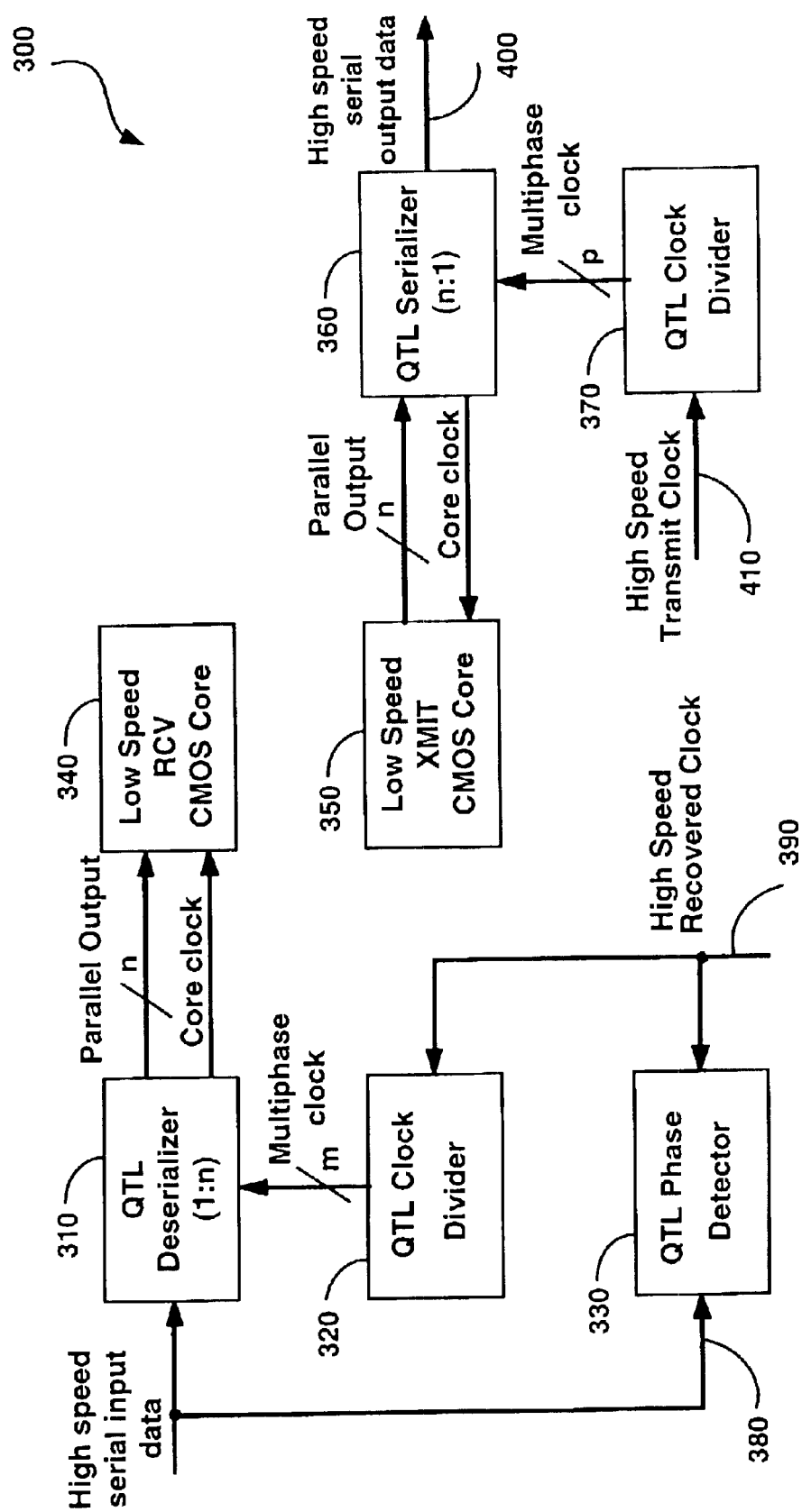
FIG. 15 shows a block diagram of an application specific integrated circuit (ASIC) including circuits of FIGS. 3 to 14.

FIG. 15 shows a block diagram of an application specific integrated circuit (ASIC) 300 using logic circuits of FIGS. 3–10, as well as conventional low speed CMOS circuitry. It is an illustration of the use of high-speed QTL logic circuitry to provide a serializer and deserializer front end in a complex communications processor.

The ASIC 300 comprises a receive section (including a I:n QTL De-serializer 310, a first QTL Clock Divider 320, a QTL Phase Detector 330, and a Low Speed RCV CMOS Core 340) and a transmit section (including a Low Speed XMIT CMOS Core 350, a n:1 QTL Serializer 360, and a second QTL Clock Divider 370). Each QTL circuit block comprises a plurality of basic circuits such as clock buffers, data buffers, multiplex circuits, latch circuits, D-type flip-flops, 2:1 serializers, and 1:2 de-serializers of the embodiments if the invention as described above.

External connections are to high-speed serial input data 380, a recovered high speed clock 390, high-speed serial output data 400, and a high-speed transmit clock 410.

The high-speed serial input data 380 is connected to both the QTL De-serializer 310 and the QTL Phase Detector 330. The recovered high-speed clock 390 is connected to the first QTL Clock Divider 320 and the QTL Phase Detector 330. The first QTL Clock Divider 320 generates a first multiphase clock signal which is connected to the QTL De-serializer 310. The outputs from the QTLDe-serializer 310(a first parallel output and a first core clock) are sent to the Low Speed RCV CMOS Core 340.

Within the receive section, the primary functions of the QTL blocks include: receiving and phase aligning the high-speed serial input data, dividing blocks of high-speed bits, received at rate R into parallel words of n bits, and sending the parallel output at a rate R/n to the low speed RCV CMOS core 340, as well as deriving the first core clock from the recovered high-speed clock and sending it to the RCV CMOS core 340.

The Low Speed XMIT CMOS Core 350 receives a second core clock from the QTL Serializer 360 and sends a second parallel output to the QTL Serializer 360. The QTL Serializer 360 further receives a second multi-phase clock signal from the second QTL Clock Divider 370, and sends the high-speed serial data out.

Within the transmit section, the primary functions of the QTL blocks include: converting the high-speed transmit clock (received at a clock rate T) into the second multiphase clock, deriving a second core clock at a rate T/n, receiving the n-bit wide parallel output from the Low Speed XMIT CMOS Core 350, and serializing the parallel output into a high-speed serial output data bit stream to be transmitted at the bit rate T.

The majority of the complex processing functions of the communications processor are performed by CMOS circuitry which is compatible (in a manufacturing sense) with the high-speed QTL logic, permitting all functions to be integrated on a single device. In effect, the QTL logic, of a first technology (MOS), provides a bridge between the serial high speed input and output (10) ports, and the circuitry of a second technology (CMOS).

This is an application where significant cost, power, and size reductions are possible due to the advantages afforded by the QTL logic circuitry of the embodiments of the invention, compared to a scenario in which the high-speed circuitry may have to be manufactured on a separate device because of technology limitations.

Thus, an improved high speed logic circuitry in the form of Quake Transistor Logic (QTL) is provided. QTL circuits are designed to be manufactured by small geometry silicon processing (0.25 micrometers and below), and process signals of 10 Gbits/s, up to 40 Gbits/s. QTL circuits have several advantages over existing high speed circuits such as lower power; higher speed; and the ability of being manufactured in a (C)MOS technology, thus allowing combination with other more complex (but lower speed) circuits on the same device.

Thus, although particular embodiments of the invention have been described in detail, it can be appreciated that alternatives, such as those mentioned above and numerous other changes, variations, and adaptations may be made without departing from the scope of the invention as defined in the following claims.

What is claimed is:

1. An electronic circuit arrangement comprising:
   a logic circuit having a differential input and a self-biasing clock buffer having a differential output, the self-biasing clock buffer comprising a driver circuit and a biasing circuit;
   the driver circuit determining its operating point via negative feedback through the biasing circuit;
   the differential output of the self-biasing clock buffer supplying a differential signal to the differential input of the logic circuit, the differential signal depending on the operating point of the driver circuit; and
   the operating point of the logic circuit being set by the differential signal.

2. A circuit arrangement as described in claim 1, wherein the operating point of the logic circuit is set through the common mode bias of the differential signal.

3. A circuit arrangement as described in claim 1, wherein the self-biasing clock buffer has an input, which is AC-coupled.

4. A circuit arrangement as described in claim 1, wherein the differential signal is DC-coupled between the differential output of the self-biasing clock buffer and the differential input of the logic circuit.

5. A circuit arrangement as described in claim 1, wherein the biasing circuit comprises a first and second of low-pass filters.

6. A circuit arrangement as described in claim 5, wherein the self-biasing clock buffer comprises a first and second amplifier, each amplifier having an AC-coupled input, a biasing point and an output, the first and second low-pass filters providing the negative feedback from the output to the biasing point of the corresponding amplifiers.

7. A circuit arrangement as described in claim 6, wherein each amplifier comprises a MOS transistor, the biasing point of the amplifier being the gate of the transistor and the output being the drain of the transistor.

8. A circuit arrangement as described in claim 1, wherein the logic circuit and the self-biasing clock buffer are made on the same substrate.

9. A circuit arrangement as described in claim 8, wherein the logic circuit and the self-biasing clock buffer are made by the same technology.

10. A circuit arrangement as described in claim 9, wherein the operating point of the logic circuit is further determined by relative sizes of MOS transistors between the logic circuit and the self-biasing circuit.

11. A circuit arrangement as described in claim 1, wherein one or both of the driver circuit and the logic circuit comprises a tuned means for modifying the frequency response of the respective circuit.

12. A circuit arrangement as described in claim 11, wherein the tuned means comprises one of the following:
   an inductive means adjusted to increase the bandwidth of the respective circuit; and
   a resonant means adjusted to resonate at substantially the frequency of the differential signal.

13. A circuit arrangement as described in claim 1, wherein the logic circuit is one or more of the following:
   a multiplexer circuit;
   a latch circuit.

14. A circuit arrangement as described in claim 1, wherein the logic circuit comprises a data buffer.

15. A circuit arrangement as described in claim 13, wherein the multiplexer circuit has a differential select input and a first and second differential data input, and the differential signal is applied to the differential select input.

16. A circuit arrangement as described in claim 13, wherein the logic circuit is a flip-flop comprising two latch circuits.

17. A circuit arrangement as described in claim 1, wherein the logic circuit is a flexible logic circuit comprising:
   an upper group of two transistor pairs, and a lower group of two transistor pairs;
   each group of transistors pairs comprising a left pair of transistors and a right pair of transistors;
   the sources of the transistors in the lower group being connected to a first power supply terminal;
   the drains of the transistors in the lower group are connected to the sources of the corresponding transistors in the upper group;
   the drains of the transistors of the left pair in the upper group are connected to a first lead of a load element whose second lead is connected to a second power supply terminal;
   the drains of the transistors of the right pair in the upper group are connected to a first lead of another load element whose second lead is connected to the second power supply terminal;
   the drains of the transistors of the left and right pairs in the upper group providing the differential output of the flexible logic circuit;
   the gates of the transistors are capable of being connected to differential outputs of any of the following according to a required topology:
      of the clock buffer;
      of said flexible logic circuit;
      of another logic circuit; and
      the topology determining a required logic function of the flexible logic circuit.

18. A circuit arrangement as described in claim 17, wherein the load elements are resistors.

19. A circuit arrangement as described in claim 18, wherein one or both of the driver circuit and the flexible logic circuit comprises a tuned means for modifying the frequency response of the respective circuit.

20. A circuit arrangement as described in claim 18, wherein the tuned means comprises one of the following:
   an inductive means adjusted to increase the bandwidth of the respective circuit; and
   a resonant means adjusted to resonate at substantially the frequency of the differential signal.

21. A circuit arrangement as described in claim 17, wherein the topology is chosen so that the required logic function is that of a multiplexer.

22. A circuit arrangement as described in claim 17, wherein the topology is chosen so that the required logic function is that of a latch.

23. A circuit arrangement as described in claim 1, wherein the logic circuit comprises more than one logic circuit driven by the self-biasing clock buffer.

24. A circuit arrangement as described in claim 23, wherein said more than one logic circuits are connected through one or more data buffers.

25. A circuit arrangement as described in claim 23, wherein said more than one logic circuits are interconnected so as to form one or more of the following:
   a serializer;
   a deserializer;
   a clock divider;
   a phase detector.

26. A circuit arrangement as described in claim 1, the arrangement being manufactured on the same substrate in combination with other circuitry.

27. A circuit arrangement as described in claim 20, the arrangement being implemented as MOS circuitry, and the other circuitry being implemented as CMOS circuitry.

28. A circuit arrangement as described in claim 27, wherein the MOS circuitry provides a bridge between serial high speed input and output (IO) ports, and the CMOS circuitry comprises a communications processor.

29. A circuit arrangement comprising circuitry of a first technology and another circuitry of a second technology, the circuitry of the first technology including:
   a logic circuit having a differential input and a self-biasing clock buffer having a differential output, the self-biasing clock buffer comprising a driver circuit and a biasing circuit;
   the driver circuit determining its operating point via negative feedback through the biasing circuit;
   the differential output of the self-biasing clock buffer supplying a differential signal to the differential input of the logic circuit, the differential signal depending on the operating point of the driver circuit; and
   the operating point of the logic circuit being set by the differential signal.

30. A circuit arrangement as described in claim 29, wherein the first technology is MOS, and the second technology is CMOS.

31. A semiconductor device, comprising a circuit arrangement as described in claim 1.

32. A circuit arrangement as described in claim 1, the arrangement being manufactured in an electronic package.

* * * * *